United States Patent [19]
Donahue et al.

[11] Patent Number: 5,859,657
[45] Date of Patent: *Jan. 12, 1999

[54] LED PRINTHEAD AND DRIVER CHIP FOR USE THEREWITH HAVING BOUNDARY SCAN TEST ARCHITECTURE

[75] Inventors: Michael John Donahue, Rochester; Paul John Fleming, Lima; Tracy Fox, Rochester; Edward Michael Kelly, Webster; Michael William Mattern, Hamlin; Carl Michael Petruzelli, Fairport, all of N.Y.

[73] Assignee: Eastman Kodak Company, Rochester, N.Y.

[*] Notice: This patent issued on a continued prosecution application filed under 37 CFR 1.53(d), and is subject to the twenty year patent term provisions of 35 U.S.C. 154(a)(2).

[21] Appl. No.: 581,025

[22] Filed: Dec. 28, 1995

[51] Int. Cl.⁶ .................................. B41J 2/47; B41J 2/435
[52] U.S. Cl. .............................................. 347/237; 347/240
[58] Field of Search ....................... 347/237, 130, 347/240; 346/107 R; 257/734; 371/22.23, 22.5

[56] References Cited

U.S. PATENT DOCUMENTS

| 4,746,941 | 5/1988 | Pham et al. | 347/237 |
|---|---|---|---|
| 4,750,010 | 6/1988 | Ayers et al. | 347/237 |
| 4,831,395 | 5/1989 | Pham et al. | 347/237 |
| 5,126,759 | 6/1992 | Small et al. | 347/237 |
| 5,253,934 | 10/1993 | Potucek et al. | 347/237 |
| 5,281,864 | 1/1994 | Hahn et al. | 327/202 |
| 5,300,960 | 4/1994 | Pham et al. | 347/130 |
| 5,317,344 | 5/1994 | Beaman et al. | 347/237 |
| 5,459,737 | 10/1995 | Andrews | 371/22.5 |
| 5,513,189 | 4/1996 | Savage | 371/22.3 |
| 5,546,406 | 8/1996 | Gillenwater | 371/22.5 |
| 5,570,375 | 10/1996 | Tsai et al. | 371/22.3 |
| 5,627,842 | 5/1997 | Brown et al. | 371/22.3 |
| 5,646,422 | 7/1997 | Hachizume | 257/48 |
| 5,708,773 | 1/1998 | Jeppesen, III et al. | 395/183.06 |

FOREIGN PATENT DOCUMENTS

| 0 358 376 | 3/1990 | European Pat. Off. . |
|---|---|---|
| 0 559 209 | 9/1993 | European Pat. Off. . |
| 2 256 058 | 11/1992 | United Kingdom . |

Primary Examiner—N. Le
Assistant Examiner—Thinh Nguyen
Attorney, Agent, or Firm—Norman Rushefsky

[57] ABSTRACT

A non-impact printhead having a plurality of driver IC chips and and a plurality of recording elements such as LEDs. Each driver IC chip includes a plurality of current-carrying channels that are operative for carrying current to respective recording elements on the printhead and a control for controlling operation of the driver. The control includes a circuit that provides a test circuit interface which includes (a) a test access port for input of update command signals and clock inputs to the test circuit; (b) a test data input terminal for inputting test data and control data into the chip; (c) a plurality of registers connected to the test data input terminal with at least one of the registers storing control data for controlling operation of the driver; (d) a test data output terminal for outputting test data and control data from the chip to an adjacent chip; and (e) a selector connected to the registers and the test data output terminal for selecting test and control data for output from the test data output terminal.

24 Claims, 19 Drawing Sheets

LED PRINTHEAD AND DRIVER CHIP FOR USE THEREWITH HAVING BOUNDARY SCAN TEST ARCHITECTURE

CROSS-REFERENCE TO RELATED APPLICATIONS

This application is related to the following applications filed concurrently herewith.

1. U.S. patent application Ser. No. 08/580,403, entitled "Driver IC With Automatic Token Direction Self-Sensing Circuitry."

2. U.S. patent application Ser. No. 08/579,954, entitled "Printer With Driver IC Configurable For Recording in Multiple Resolutions."

3. U.S. patent application Ser. No. 08/580,262, entitled "Method for Constructing a Light-Emitting Diode Printhead With A Multiple DPI Resolution Driver IC."

BACKGROUND OF THE INVENTION

1. Field of the Invention

The present invention relates to non-impact printer apparatus and method for recording and to circuitry thereon for controlling data and other signals flowing to a printhead forming part of the printer apparatus.

2. Description of the Prior Art

The increasing functionality of integrated circuits (ICs) and circuit boards supporting such ICs has made testing of the boards by conventional techniques ever more difficult. For this reason, the Institute of Electronic and Electrical Engineers (IEEE) has adopted a standard (1149.1) for testing circuit boards by a technique known as boundary scan. The IEEE 1149.1 proposal is substantially identical to the boundary scan architecture adopted by the Joint Test Action Group (JTAG) of Europe and North America which is described in the document JTAG Boundary Scan Architecture Version 2.0, published in March 1988.

In accordance with the JTAG and IEEE boundary scan architecture individual boundary scan cells in a device (i.e. an integrated circuit ) are serially linked to establish a boundary scan register. Under the control of a test access port (TAP) controller in each device, each bit of an externally generated test vector TDI is shifted into a successive one of the cells. Thereafter, the bit in each "output" cell (i.e., a cell whose parallel output is fed to another cell) is applied to each "input" cell (i.e., a cell whose parallel input is coupled to an output cell). The bit at the parallel input of each "input" cell is captured (i.e., retained in place of the bit originally shifted into the cell). After the bits are captured, the bits are shifted out of all of the cells and are compared to the bits in a vector expected to be produced when no faults are present. Any deviation indicates a faulty connection between cells.

In U.S. Pat. Nos. 5,126,759 and 5,253,934 light-emitting diode (LED) printheads are described having plural input lines for inputting control signals and image data to each of plural driver ICs located on the printheads. In addition to power ($V_{cc}$ and $V_{DD}$) and ground, other control signals lines include an exposure clock signal (EXPCLK), latch signals, a token bit signal, a token bit clock signal for shifting the token bit and a token bit directional signal for determining the direction for latching data in the driver chip. As noted in the aforementioned patents, the exposure clock signal provides non-linear clock pulses used by the driver for controlling on-time (pulsewidth modulated) of each LED in accordance with plural bits of image data associated with a pixel to be recorded. The token bit signal is used to designate a latch register which is associated with a particular LED for latching of a multibit data signal. As data is forwarded to a data bus in the driver, the token bit, token clock signal and token bit directional signal allow appropriate image data to be captured in a corresponding latch register. The respective data can then be printed for respective periods determined by the image data and the exposure clock pulses. In addition to the noted control signals, additional select signals are provided to the driver chips to decode various modes of operation. Among these modes are two modes that allow a multiplexed data signal to access two registers (LREF and GREF) common to every driver chip, which are used to bias the current output level of the drivers. In addition, there is a mode which allows a "bias monitor" output to be activated which controls monitoring of driver current in an extra channel. All of these additional functions are accessed serially in time over the same line. Since normal operation of passing image data over this same line is one of the defined modes of operation, this excludes access to these other functional modes during normal operation, i.e., when image data is passed over the line.

It would be desirable to be able to access certain registers for example, the LREF and GREF registers at any time without interrupting normal image data loading and printing operation and without the need of a dedicated secondary data path into the driver chip. It would also be desirable to access additional control functions on the driver chips without the need of dedicated secondary data paths while providing the standard IEEE 1149.1 testability functions, including boundary scan for the driver chip. It would also be desirable to provide control data for these control functions to the driver chip during recording of a line of current pixels without affecting such printing so that the control data then may be used to control recording of a line of subsequent pixels.

SUMMARY OF THE INVENTION

In accordance with one aspect of the invention, there is provided a driver IC chip for use in a non-impact printhead having a plurality of recording elements, the driver IC chip comprising driver means including a plurality of current-carrying channels that are operative for carrying current to respective recording elements on the printhead; control means for controlling operation of the driver means; the control means including circuit means for providing a test circuit interface including (a) a test access port for input of update command signals and clock inputs to said test circuit; (b) a test data input terminal for inputting test data and control data into said chip; (c) a plurality of first registers connected to the test data input terminal at least one of said first registers storing control data for controlling operation of the driver means; (d) a test data output terminal for outputting test data and control data from said chip to an adjacent chip; (e) selection means connected to said first registers and said test data output terminal for selecting test and control data for output from said test data output terminal.

In accordance with another aspect of the invention, there is provided a printhead comprising a recording element; an integrated circuit driver means for generating current for driving the recording element for recording, the driver means including means for storing first image data for recording a current pixel and means for storing second image data for recording a subsequent pixel by the recording element; the driver means including a test circuit means that includes register means having a boundary scan architecture for testing connectivity on the driver, the test circuit means including a data input terminal and a data output terminal; the register means including means for storing control data other than image data for determining a control feature for operation of the driver means in a non-test mode, means for storing in said register means new control data during loading of second image data and printing of first data without affecting said control feature of the driver during printing of the first image data; and means for providing a signal that updates said control feature in accordance with the new control data after recording of said first data to affect control of said feature for recording said second image data.

In accordance with yet another aspect of the invention, there is provided a method of non-impact printing using a plurality of recording elements, the method comprising selectively energizing a plurality of current-carrying channels that are operative for carrying current to respective recording elements for recording a current line of pixels; controlling operation of current in the channels; the steps of controlling including (a) providing a test circuit interface that includes a test access port for receiving inputs of update command signals and clock inputs to said test circuit; and (b) inputting new control data, for controlling current in the channels for recording a subsequent line of pixels, into a plurality of first register cells connected to the test data input terminal during operation of the recording elements for recording the current line of pixels without affecting current in the channels for recording the subsequent line of pixels.

In yet still another aspect of the invention, there is provided a printhead comprising a plurality of recording elements; a plurality of integrated circuit driver means for generating current for driving respective ones of the recording elements for recording, each integrated circuit driver means including a means for storing first image data for recording a current pixel and means for storing second image data for recording a subsequent pixel by the respective recording elements; and a test circuit means that includes register means for testing connectivity on the driver, the test circuit means including a data input terminal and a test data output terminal, the register means including means for storing control data other than image data for determining a control feature for operation of the driver means in a non-test mode.

The above and other objects and features of the present invention will become apparent from the following description taken in conjunction with the accompanying drawings.

DETAILED DESCRIPTION OF THE PREFERRED EMBODIMENTS

Figure 1:
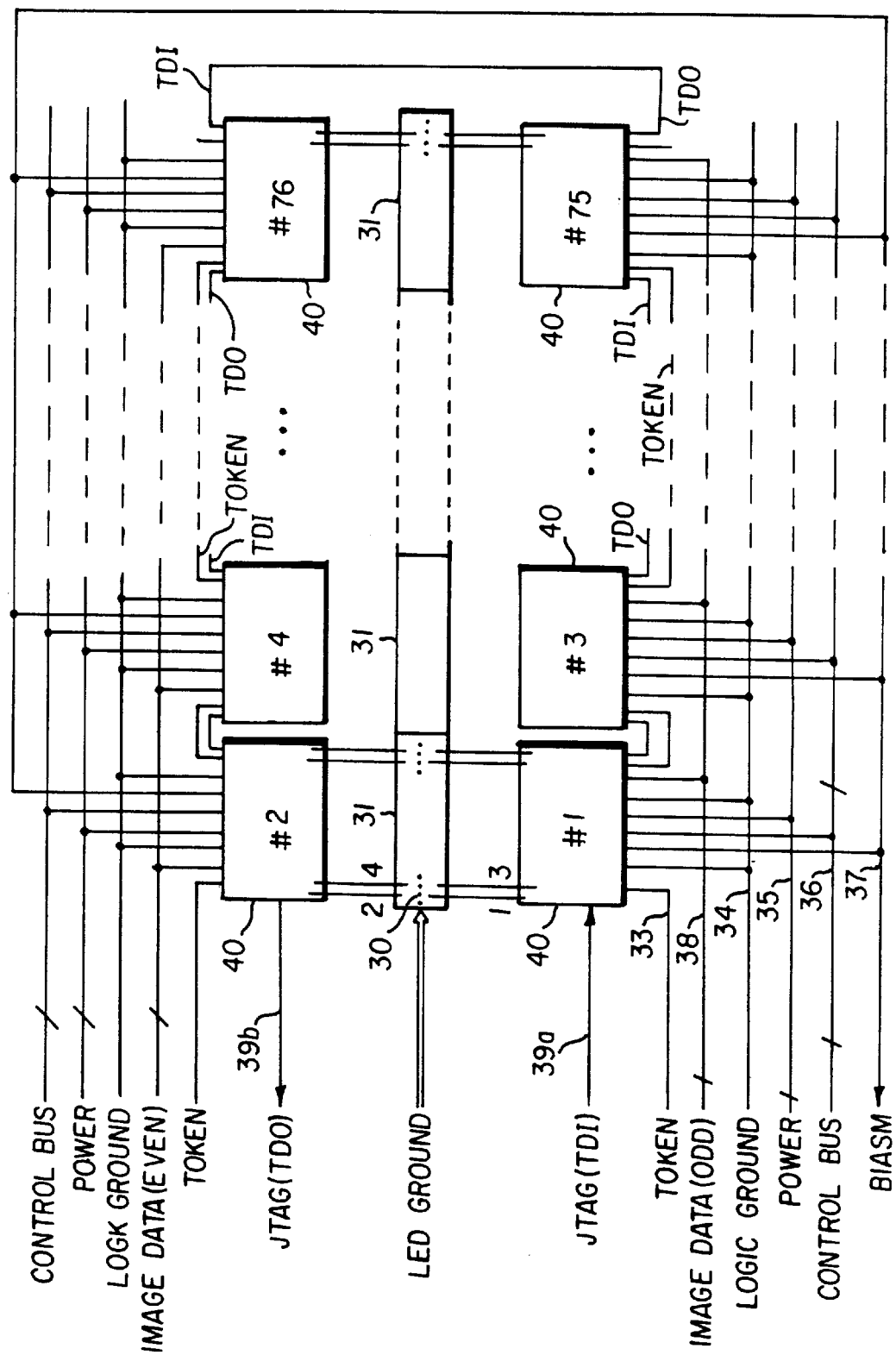
FIG. 1 is a block diagram of a printhead according to the invention, the printhead including a plurality of driver chips for driving LEDs formed on LED chip arrays.

In the description below, details are provided regarding one or more exemplary embodiments forming the present invention. Apparatus and/or circuitry not specifically shown or described herein are selectable from those known in the prior art.

LED printheads, as known in the art, include a single row of LEDs formed in chip arrays. Each array may contain say 192 LEDs at a resolution of say 600 dots per inch (DPI) or 128 LEDs at 400 DPI or 96 LEDs at 300 DPI. As may be seen from FIG. 1, the arrays 31 are mounted end to end on the printhead 20 so that a single row of several thousand LEDs 30 is provided. Driver IC chips 40 may be mounted on one or both sides of this row of LEDs and these driver IC chips incorporate the circuitry for handling the data signals to determine which LEDs are to be turned on or be illuminated during a pixel (picture element) recording period and for providing the driving currents to the LEDs turned on. In one typical application, two driver chips incorporate the circuitry for driving the 128 LEDs on a chip array. One of these driver chips is used to drive the 64 odd-numbered LEDs and the other is used to drive the 64 even-numbered LEDs. Parallel signal carrying lines 33–39 are provided to carry signals from a logic control unit and power supply to control operation of the printhead.

Figure 2:
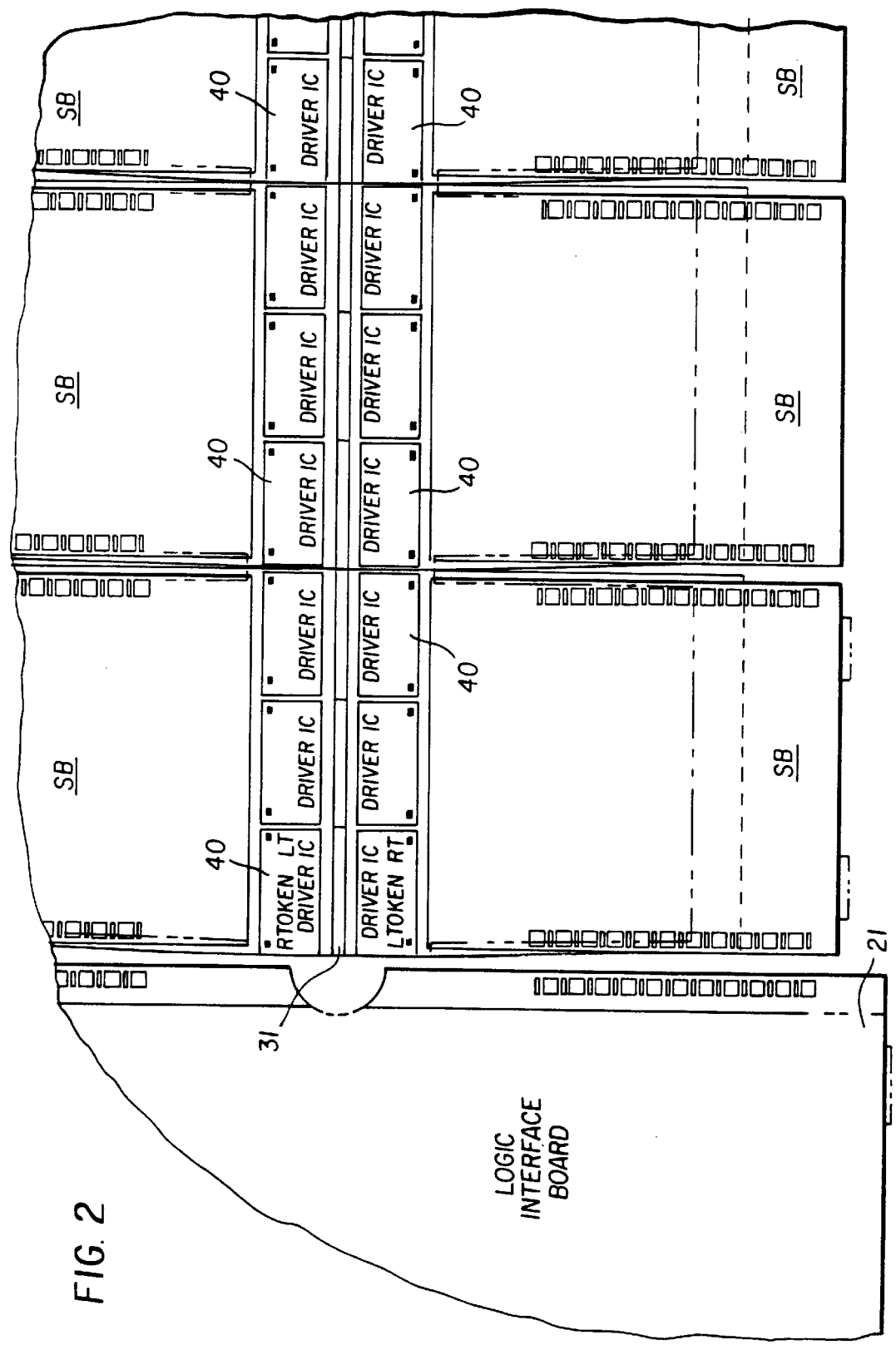
FIG. 2 is a layout drawing of an interface board and printing portion of the printhead of FIG. 1 showing the printhead of FIG. 1 with a modular construction.

With reference to FIG. 2, the printhead may have the driver chips and LED chip arrays mounted on modules as described in U.S. Pat. No. 5,317,344, the contents of which are incorporated herein by reference. In this patent, an LED printhead has a metal or metal-coated ceramic tile on which is supported a plurality of driver chips (40) and LED chip arrays (31). A pair of spreader boards (SB) are provided outboard of the driver chips for distributing signals to various driver chips to which they are connected. The spreader boards on adjacent modules are daisy-chained together by bond pads and wire bonds located adjacent the edges of the tiles. The LED arrays and driver chips may be mounted on the spreader board.

Figure 3:
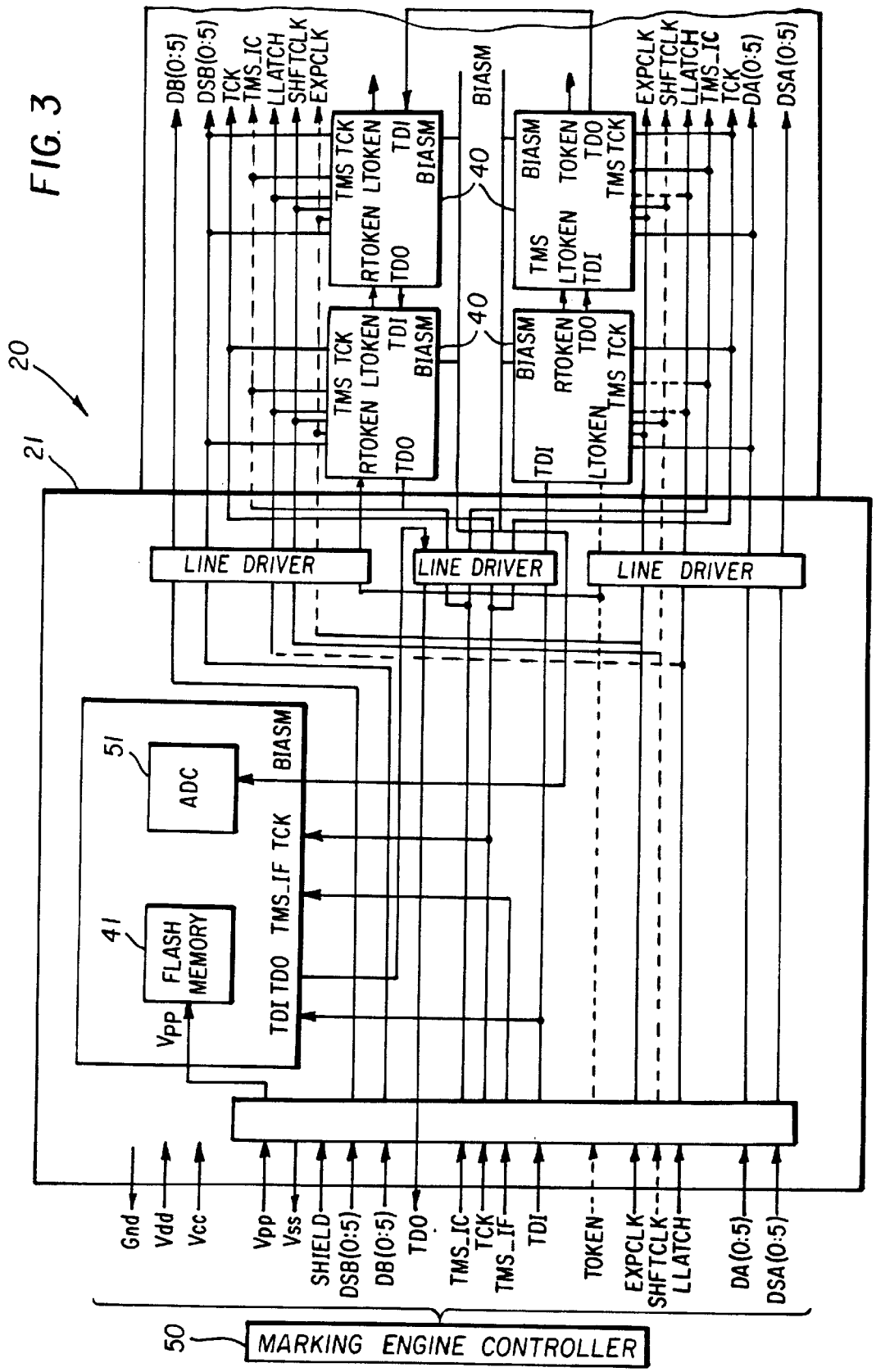
FIG. 3 is a schematic of signal flow to and from the interface board and printing portion of the printhead of FIG. 1 and to and from a marking engine controller.
Figure 4:
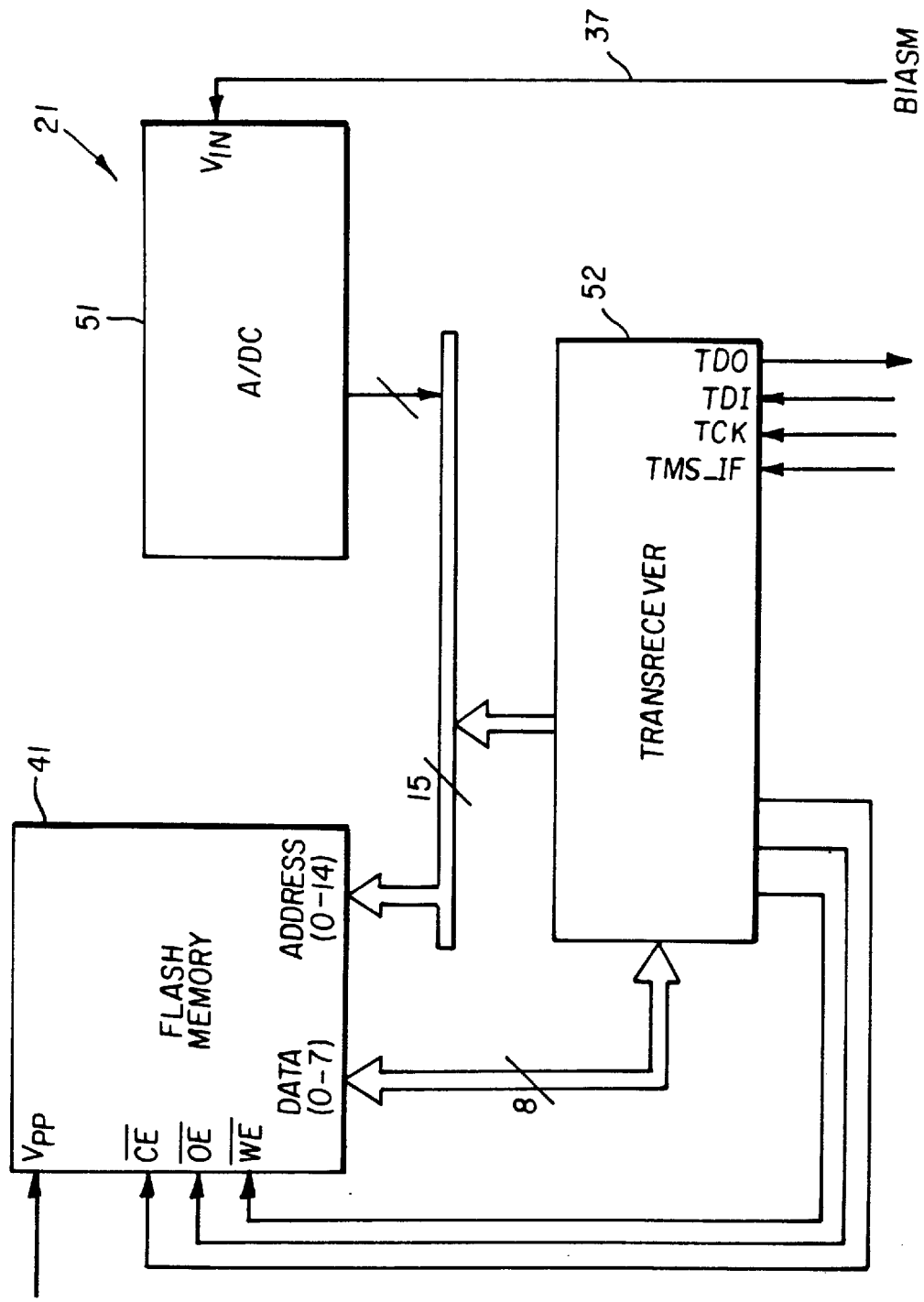
FIG. 4 is a more detailed schematic of some of the signals on the interface board of FIG. 2.

The modular construction allows for separate assembly and test of the modules before mounting on the printhead support structure or base. However, the modular construction is only an example and in accordance with the invention the printhead may be assembled without a modular construction. Also associated with the printhead is an interface board. With reference now to FIGS. 2, 3 and 4, the interface board (21) includes a 32K×8 flash memory (41) (electrically erasable PROM), an analog to digital converter (51) (ADC), a control chip (52) for controlling reading and writing of data to the flash memory and operation of the ADC, a connector and termination network and various other leads and components such as resistors, capacitors and a reference voltage source that are well known for enabling the particular components mounted on the circuit board comprising the interface board. Further description of the operation of the interface board will be provided below.

Figure 5:
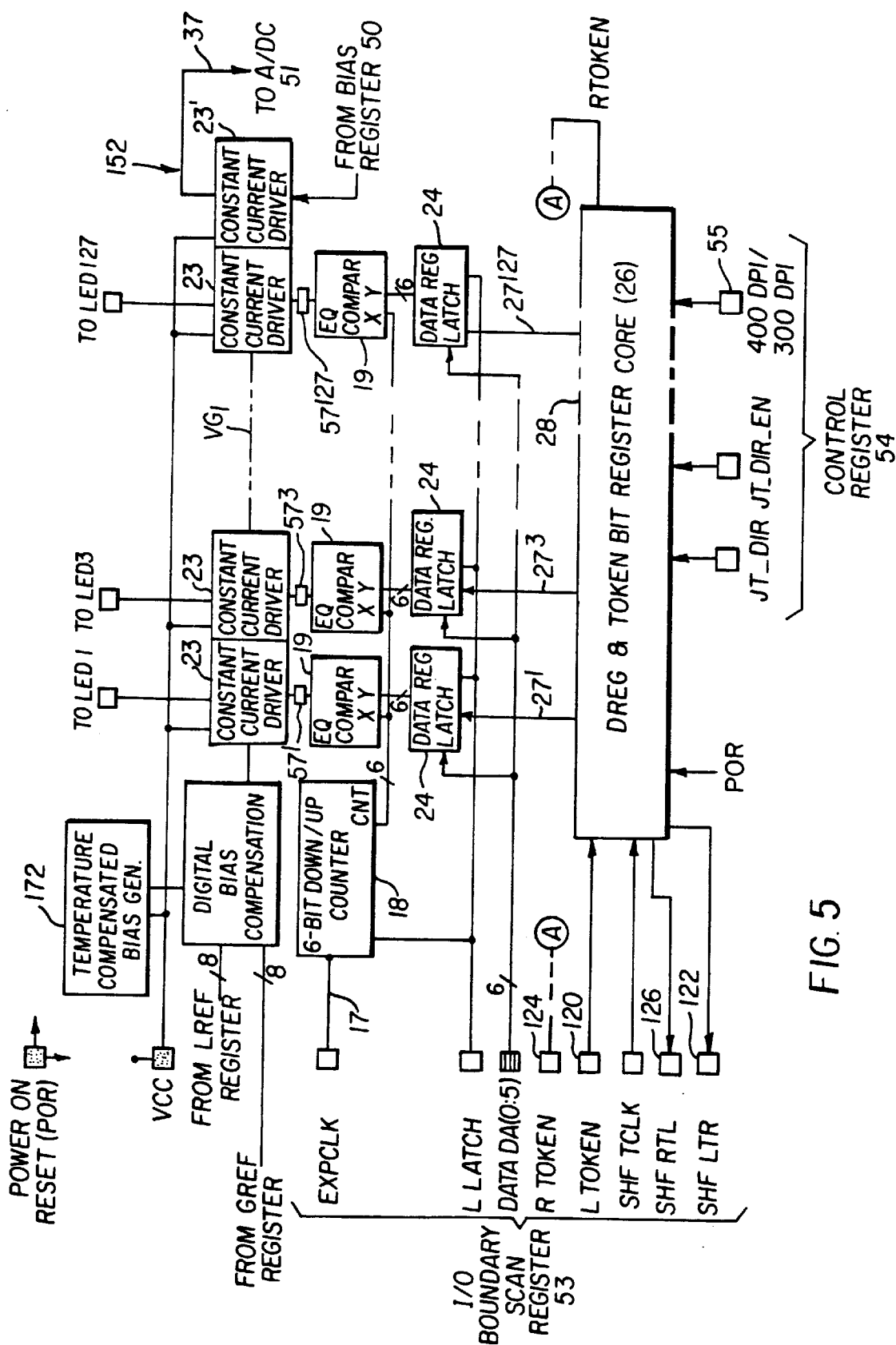
FIG. 5 is a block diagram of a portion of the circuits provided on a driver chip according to the invention.

With reference now to FIG. 5, there is a shown a schematic of the functional parts of the driver IC chip (40) whose primary function is to generate pulse-width modulated currents in 64 channels for selectively driving 64 corresponding LEDs on an associated LED chip array. Each of these channels includes a data latch register 24 for storing in this example a six-bit image data value which represents a corrected image data signal of a grey-level data signal that is corrected for nonuniformities in the LEDs across this printhead. The grey-level data signal prior to correction may define a grey level of a pixel using 1, 2 or 4-bits.

A data source such as a computer, word processor, image scanner or other source of digitized image data (not shown), provides image data signals to a data processor (not shown) which may comprise a raster image processor. The data processor under control of clock pulses from a marking engine controller (MEC) (50), provides a plurality of outputs including rasterized data outputs and control signals which are fed to the printhead. In addition, the MEC (50) provides exposure clock pulses via line 17 to a down/up counter 18 (FIG. 5) which, when enabled by a signal from the MEC, counts such clock pulses and provides at an output having a plurality of lines a digital signal representation of the state of the counter. Typically, such a counter has one line representing a least significant bit of such count and other lines representing other more significant bits. In accordance with a technique fully described in U.S. Pat. No. 4,750,010 in the names of Ayers et al, the contents of which are incorporated herein by this reference, the output of counter 18 is provided to a first set of input terminals (X) to a comparator 19 (see FIG. 5) associated with each recording element 30, i.e., LED in this embodiment. A plurality of data lines from each of a plurality of corresponding data latch registers 24 is provided to a second set of input terminals (Y) associated with each comparator 19. The comparators 19 all compare the output of the counter 18 with the value of the respective data. As will be described herein, the image data signals provided to each comparator relates to a desired ON time or period of enablement for a respective LED 30 for the recording of a particular pixel. The image data signals provided to each comparator 19 during the printing of a single line of dots by the row of LEDs is related to the desired pixel or dot density to be exposed onto the image receiver medium by that LED for that particular line of dots. Six independent lines of data DA (0:5) provide a six bit digital image data signal that allows for grey-scale variation of the output of each LED during each cycle of operation. During each cycle the data to each comparator may comprise six binary bits representing an amount from decimal 0 to decimal 63. The data lines comprise a bus or plurality of data lines that are simultaneously available to all data registers in the driver chips associated with this segment of the printhead as will be described below.

Suppose, for example, that an LED, LED1, is to be enabled for a time period equal to 20 clock periods plus TMIN. TMIN represents a pre-established minimum LED on time. In response to a start pulse on line LLATCH, the counter 18 is enabled and commences to count exposure clock pulses from line 17 from decimal 63 to 0. Note that the clock pulses may be generated to have a variable programmable period. The six bit output of counter 18 is coupled to one set of inputs at terminal X of each of the comparators. This counter is now compared with the data input at another set of inputs at terminal Y of this comparator which represents in binary form decimal ten. When there is a "match," i.e., when the count of terminal X is 10, a pulse is provided at the output terminal of comparator 19 to enable the constant current driver 23 to commence and maintain current to LED1. After the counter counts down to zero, the counter may be inhibited from counting additional clock pulses for a period TMIN that is either programmed into the counter or provided by other suitable means. After this predetermined time period TMIN, if used, the counter is set to count in its up mode and commences counting clock pulses again. When the counter, in its count up mode reaches decimal 10, current to the LED ceases. The other LEDs, etc. operate in similar fashion, but their data may require different count values to turn on and off. What these LEDs will thus have in common is that all will have their respective current pulses centered, i.e., the midpoints of the respective current pulses will occur at the same time. If desired, assymetric exposure clock waveforms may be input to the counter 18 on line 17 during count-down and count-up so that the pulses are not center pulsewidth-modulated. The pulse duration for each LED during each line of print is varied, however, in accordance with their respective image data signals. Reference is also made to U.S. Pat. No. 5,300,960, regarding a clocking scheme using a non-linear clock, the contents of which are incorporated by this reference. As noted in this latter reference, correction for unequal light output from LED to LED may be provided by adjustment of the grey level image data in accordance with the characteristics of each LED. Thus, data for an LED can be corrected or modified to provide an input count at terminal Y that represents data modified by the exposure characteristics of the LED. For example, for an LED that is a relatively stronger light emitter the corrected data would modify grey level data bits for that LED to reduce the count that otherwise would be provided at terminal Y for an LED that is an average light emitter.

Still other circuitry for balancing the driving current to the LEDs is described below.

Data Loading

The image data signals are output by the data processor in accordance with image data signals for the odd-numbered LEDs and image data signals for the even-numbered LEDs. In addition, data may be further divided into data for high and low-numbered LEDs so that four sets of six-bit data may be sent to the printhead simultaneously as illustrated in FIG. 3 (lines DA, DSA, DB, DSB) under respective token bit control. Still higher divisions are possible. For example, the printhead may be considered to comprise three segments;

i.e., low numbered LEDs, medium numbered LEDs and high numbered LEDs with a breakdown for odd and even-numbered LEDs there may be provided six sets of six-bit data. Discussion will now be made with regard to the image data signals for the low odd-numbered LEDs, since operation and circuitry for the other LEDs is identical. Data lines DA (0:5) are independent lines each carrying a signal representing a digital bit (0 or 1) so that together their respective signals define a digital six bit number from decimal 0 to decimal 63. This image data signal is passed along lines DA (0:5) on the printhead which comprise an image data signal bus. Associated with each LED is a data latch register means 24 (FIG. 5) for latching data from this bus during each cycle of operation for printing a single line of dots or pixels. As will be described, a token bit is used to enable a data register means associated with a particular LED to accept the data while other data latch register means associated with other LEDs await their respective data.

The data latch register means 24 for each LED comprises a pair of latches or bi-stable multivibrators for each of the six data lines. The pair of latches are connected in a master-slave relationship wherein in response to a token bit signal at the enable input terminal of the master latch, an image data signal at the data input terminal of the master latch will cause the output of the master latch to either change or remain the same depending upon the image data signal. It will be noted that the six master latches in the data register means of each LED are commonly connected to a respective line 27 (three of such lines $27^1$, $27^{23}$, and $27^{127}$ are illustrated) to simultaneously receive the token bit signal from the token bit shift register 28.

Figure 14:
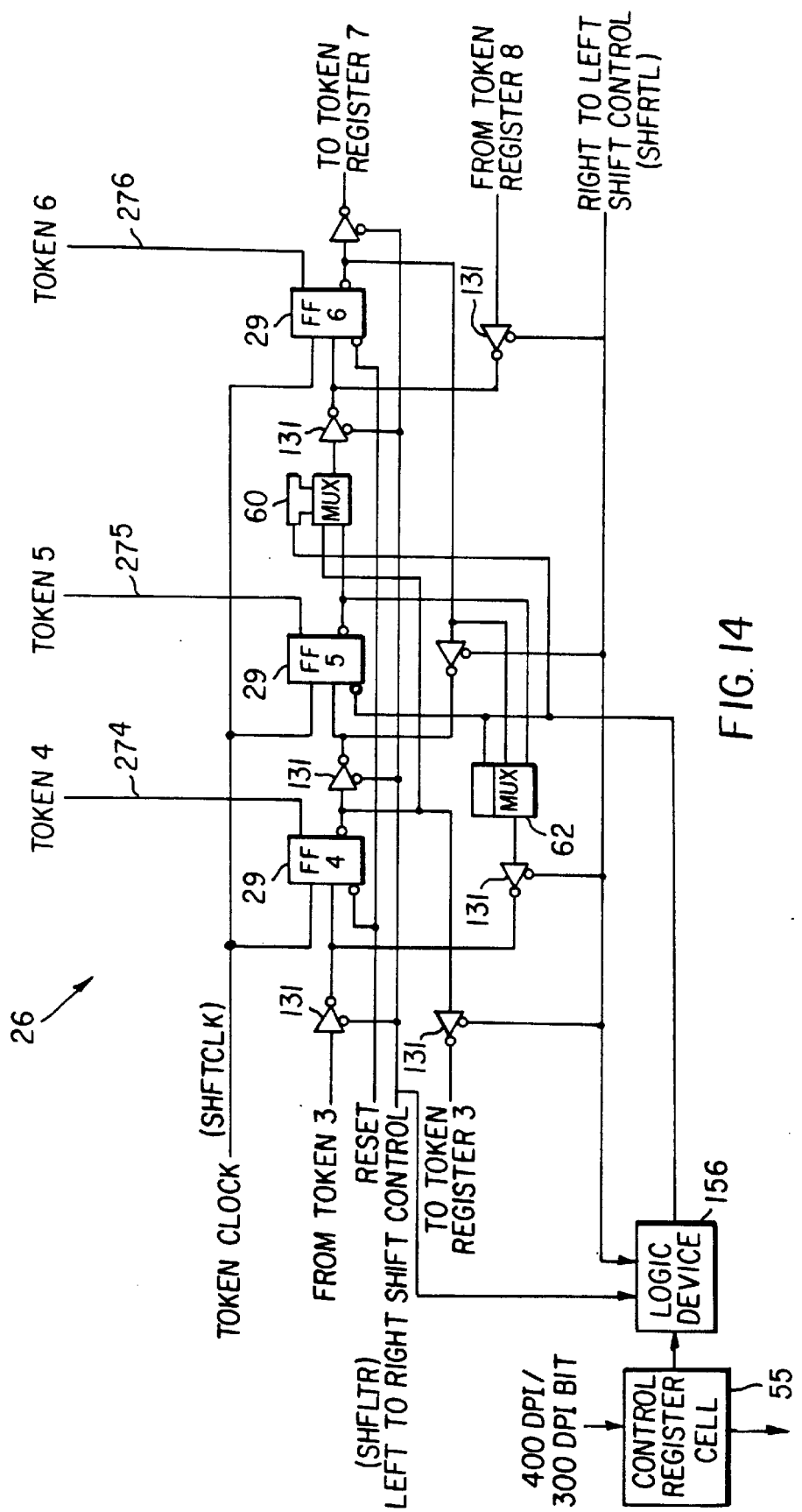
FIG. 14 is a schematic of circuit used on the driver chip of FIG. 5 for having a token skip feature so that image data is not latched in not-used driver channels.

With reference to FIGS. 5 and 14, the token bit shift register 28 includes a token bit shift register core 26 that comprises a series of flip-flops 29 which have token clock pulses (SHFTCLK) applied to the clock terminals thereof and the signal representing the token bit input to the data input terminal of each. Note that a separate token bit signal (LTOKEN, RTOKEN) will be provided to the even and odd token bit shift registers for the even and odd numbered LEDs so that the token signal shifts either left to right or right to left through the respective driver chip. The output of each of these flip-flops 29 is connected to the data input terminal of the next flipflop 29 in the series. Buffers 31 with enable inputs and direction controls are coupled to the flip-flops 29 so that programmable control may be made of the direction for shifting the token bit along the token bit shift register 28. In the example where the token bit is to be shifted from left to right in FIG. 5 for the Data Odd lower numbered quarter of the printhead, the signal line JT_DIR (token direction) is made at an appropriate logic level to allow the token bit on line LTOKEN to pass from left to right. Thus, in response to clock pulses (SHFTCLK) the token bit is passed from stage to stage (left to right in FIG. 5) of the token bit shift register 28 and accordingly outputted sequentially over respective lines 27 for enablement of all the master latches of a respective data latch register 24. With movement of the token bit from stage to stage of the shift register 28 the corrected image data bits occurring on lines DA (0:5) are accepted by the data registers 24 in turn from left to right until all the data registers on this quarter of the printhead have acquired their respective six bits of data. A latch enable signal is then pulsed low on line LLATCH to cause the respective slave latches to latch the data at their respective outputs. The respective outputs of the slave latches are now communicated to the data input terminals Y of the respective comparators 19 for determining the duration of exposure for each LED in accordance with the techniques described above. The master latches are now free to receive the image data signals for the next line of dots or pixels to be recorded while the current line of pixels are being recorded.

After LLATCH returns to its inactive level, on the first rising edge of EXPCLK while a particular comparator 19 output is at a logic high level, the associated constant current driver 23 is enabled for a period determined by the data in the outputs of the slave latches of the data latch register 24.

Current Drivers

Reference may be had to U.S. Pat. No. 5,126,759 for a description of one current driving circuit the contents of which are incorporated herein by reference. It will appreciated that other circuits known in the art may be used and that a specific circuit is not critical to this invention. In a typical application, the enable signal created causes transistors to act as switches and form a part of a current mirror driving circuit that includes a master circuit formed by transistors Q1, Q2 (FIG. 6C) and a series of digitally controlled transistors. More details concerning the digitally controlled transistors may be found below with reference to the discussion of FIGS. 6A and 6B. Briefly, these digitally controlled transistors may be selectively turned on to establish a signal I (CHIP BIAS) to thereby regulate a desired current level for the LEDs driven by this driver chip. As may be noted in FIG. 6C, circuitry for driving one of the LEDs, i.e., LED1 is illustrated; it being understood that the driver chip would have appropriate circuits typified by those described below for driving say 64 of the odd-numbered LEDs in an LED chip array having, for example, 128 LEDs. Another driver chip on the other side of the LED chip array would be used to drive the 64 even-numbered LEDs.

The current through the driver chip's master circuit establishes a potential VG1 on line 117. Directly in series with LED1 are two transistors Q3, Q4 forming a part of the slave circuit in each channel. Transistor Q4 is biased to be always conductive while transistor Q4 is switched on and off and thus is the transistor controlling whether or not current is driven to LED1. The gate or control electrode of transistor Q4 is coupled to a data driven enabling means that is the circuitry of FIG. 5 which controls whether or not an LED is to be turned on and for how long. As noted above in a grey level printhead, the LED is to be turned on for a duration determined by the grey level corrected data signals input to the printhead.

As noted above, transistor Q4 conducts current to LED1 for a time period controlled by the data bits for recording an appropriate pixel. The level of current for recording this pixel is controlled by the current mirror which is responsive to the current level I(CHIP BIAS). The circuit for generating I(CHIP BIAS) will now be described.

Figures 6, 6A:
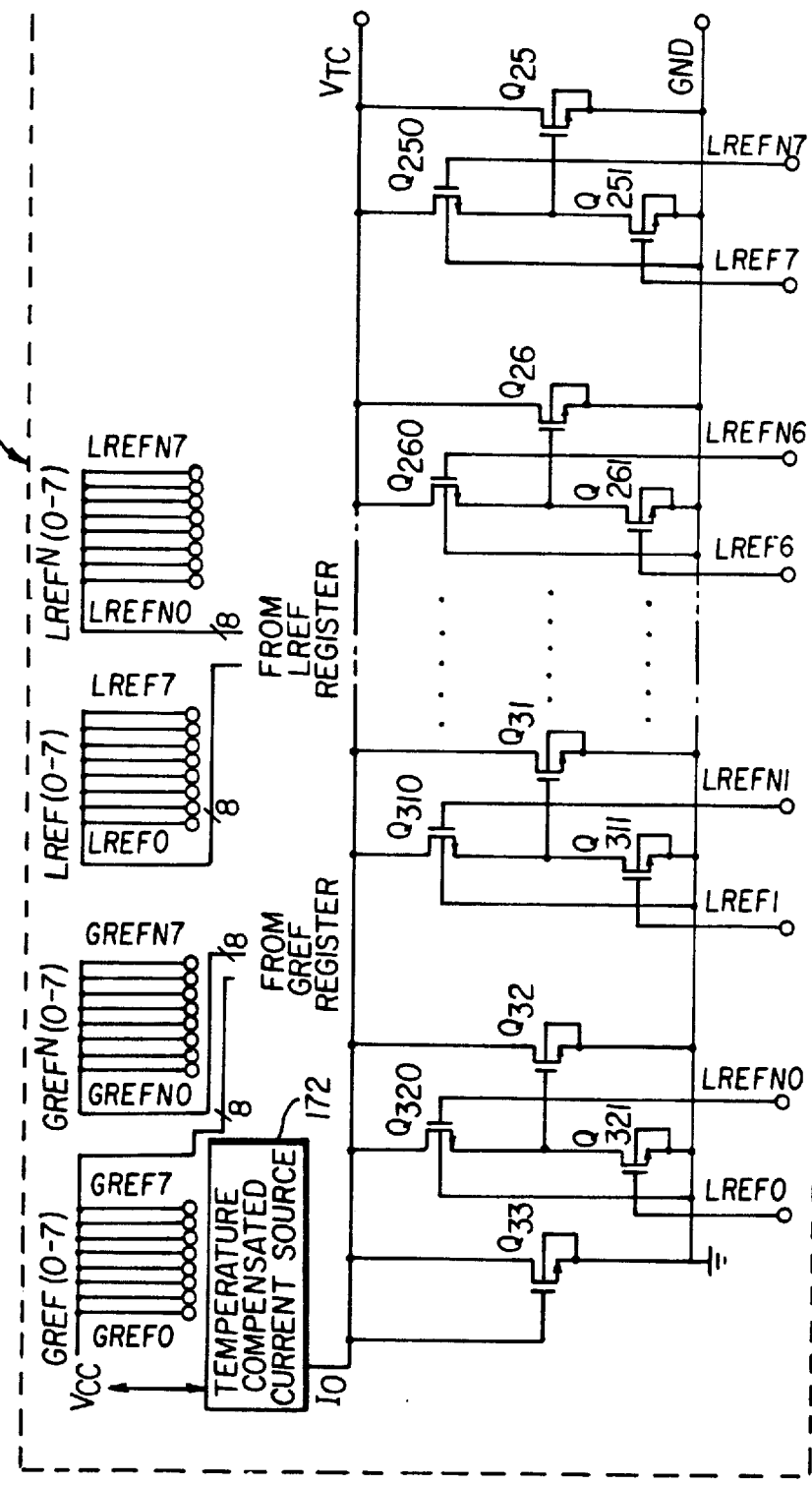
FIGS. 6 and 6A–C are a schematic of a current driving portion of the driver chip of FIG. 5.
Figure 6B:
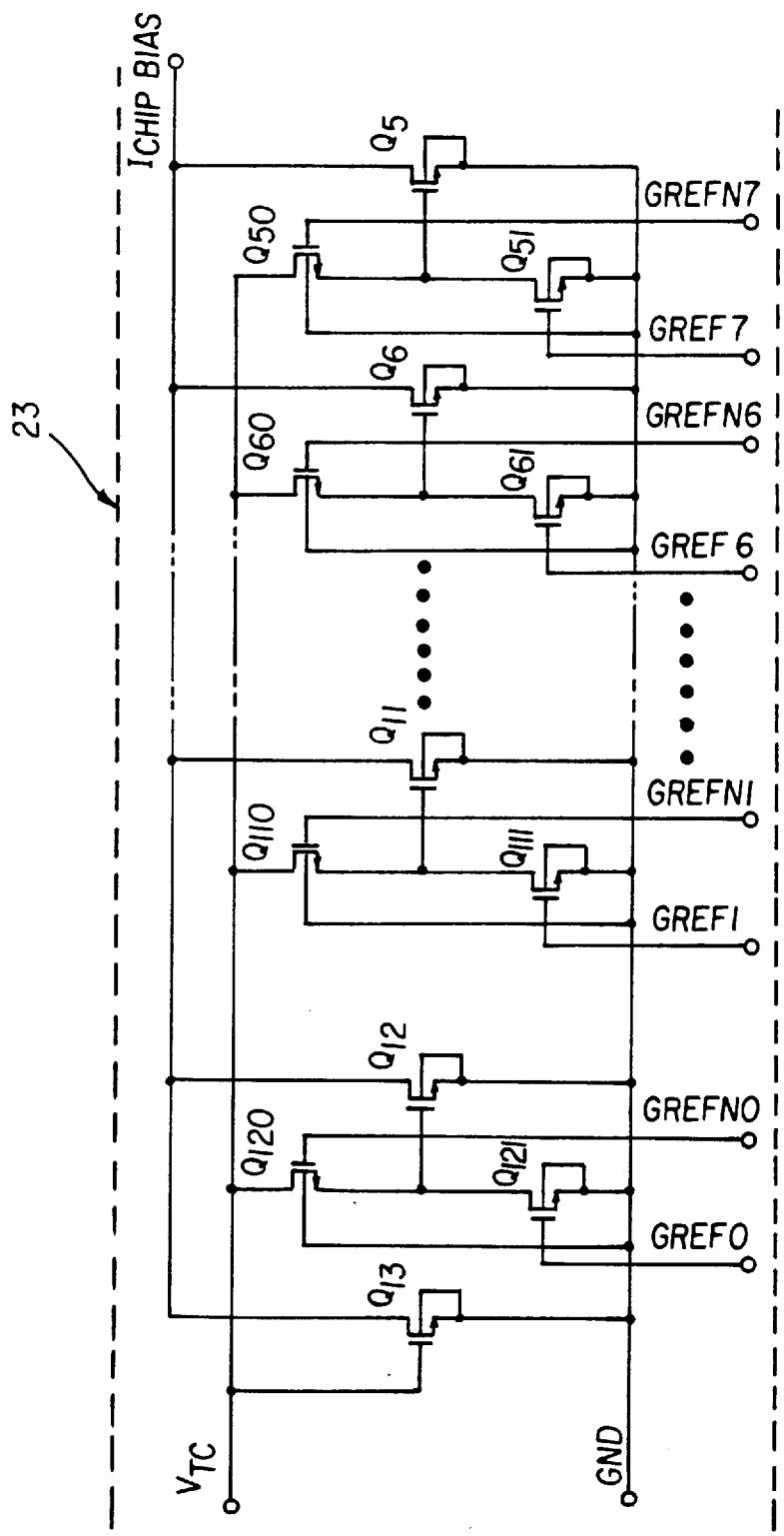
Figure 6C:
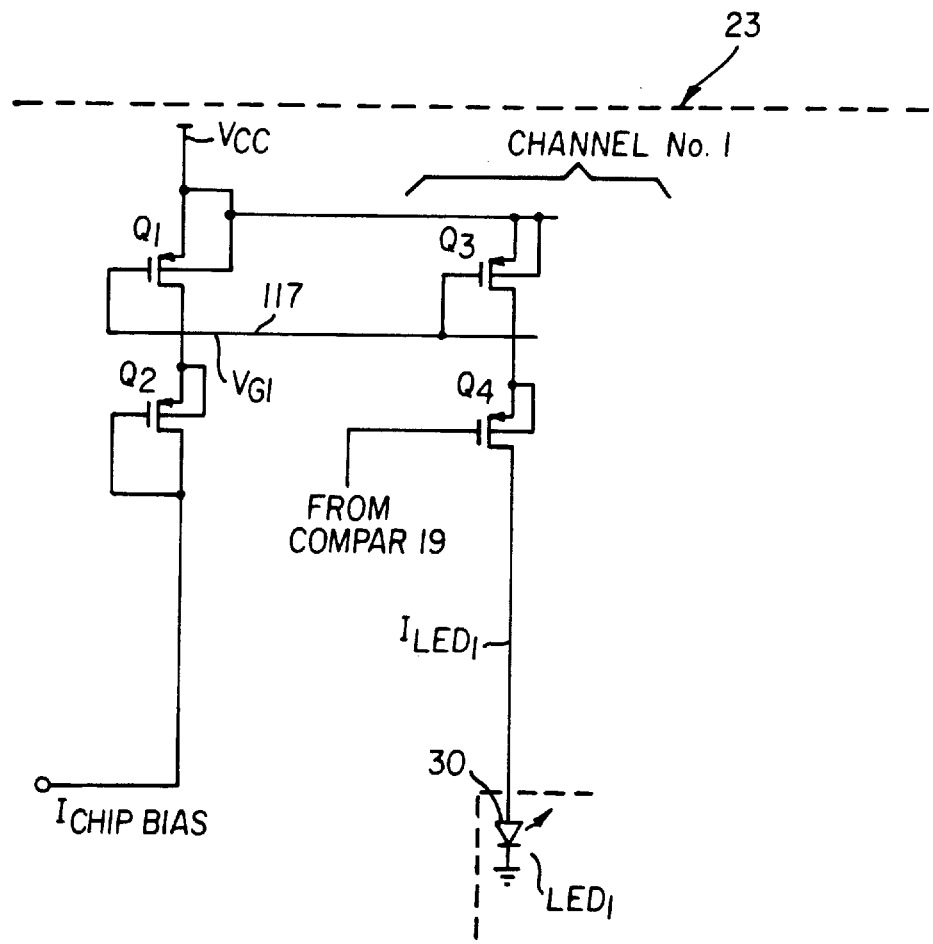

When transistor Q4 is turned on, the current passing there through mirrors, i.e., is either the same or proportional to, the current passing through transistor Q2. The current passing through transistor Q2, in turn, is equal to I(CHIP BIAS). With reference now to FIGS. 6A and 6B, this current, I(CHIP BIAS) in turn is controlled by three factors comprising a temperature compensated current source 172, a first group of eight digitally controlled NMOSFET transistors Q25, Q26 . . . , Q31, Q32 and a second group of eight digitally controlled NMOSFET transistors Q5, Q6 . . . , Q11, Q12. Associated with the first group is a non-digitally controlled NMOSFET transistor Q33. Similarly associated with the second group is non-digitally controlled NMOSFET transistor Q13. As may be noted in FIGS. 6A and 6B, not all of the transistors are shown and the number of digitally controlled transistors provided in each group determines the level of control. Transistors Q25, . . . , Q32 are parallel connected transistors whose respective gate width to gate length ratios are scaled so that their respective currents are scaled or weighted in powers of two. Transistor Q5, ..., Q32 are similarly scaled.

Each digitally controlled transistor is controlled by a logic signal applied to a respective two-transistor switch circuit associated with the transistor. For example, the circuit defined by NMOSFET transistors Q250 and Q251 cause current to flow through transistor Q25 when a high level logic signal is applied to the gate of transistor Q250 and a complementary low logic signal is applied to the gate of transistor Q251. The logic signals for controlling which of the current-carrying transistors are to be turned on are controlled by an LREF register which stores an 8-bit digital word and logic which provides its 8-bit complement representing a desired current control signal to turn on respective ones of the eight current conducting transistors Q25, ... Q32. In conjunction with transistor Q33, which is on continuously, this group of transistors is used for "localized" control of LED current. By this, it is meant that the digital word stored in the LREF register is specific for this driver chip and will be determined by adjustment of driver current to the LEDs driven by this driver chip until the LEDs each provide a desired light output level. This digital word may be input to the LREF register from memory in the MEC or the flash memory 41 provided on the printhead's interface board 21.

This digital word may also be changed in response to the temperature of the driver chip as will be described below. Briefly, the level of current from an extra current mirror channel 152 (FIG. 5) on each driver chip is used as a measure of temperature. A voltage generated by this current is digitized and compared with a value based on the digital words in registers LREF and GREF. In response thereto, a new digital word is written into register LREF, if a change in current level is required according to an algorithm stored in memory, for example in the MEC. At start-up, the MEC is programmed to provide the printhead a default setting to a particular set of digital words for placement into registers LREF and GREF.

As noted in U.S. Pat. No. 4,831,395, the contents of which are incorporated by this reference, the MEC may be programmed to maintain a count of prior activations of each LED and adjust a control voltage according to a program based on the aging characteristics of the printhead.

Alternatively, the operator or service technician may indicate that adjustments to density made via an operator control panel are desirable.

After this initial calibration and as the printhead ages through repeated use, both temperature and age factors operate to degrade light output. The affects due to aging will generally be similar to all LEDs and are corrected for by adjustment of an 8-bit digital word and its 8-bit complement stored in register GREF.

The digital word stored in register GREF controls eight currentcarrying NMOSFET transistors Q5, ... , Q12. Associated with this group of transistors is continuously conducting NMOSFET transistor Q13. The transistors gate width to length ratios may be designed so that the transistors are digitally weighted and thus have different current carrying characteristics. The 8-bit word stored in register GREF is the same as that stored in identical GREF registers on the other driver chips. As conditions in the electrophotographic process (EP) change as determined by say various sensors or as the printhead ages, a new 8-bit digital word is calculated by the LCU or the interface board and input into the registers GREF. The calculation of this 8-bit word for process changes or aging may be based on empirical determinations made using similar printheads or based upon a calibration of this printhead using an optical sensor that senses the output from each or selected LEDs or by sensing patches recorded on the photoconductor and/or humidity, temperature and other factors that affect the EP process. Data for updating register GREF may also be stored in the flash memory 41.

As noted above, a third factor for adjustment to maintain LED uniformity of light output from chip-to-chip is a temperature compensated current source 172 (FIG. 6A). This current source includes a temperature sensor and circuitry which will assist in boosting current to the LED's in response to increases in temperature. Various circuits for accomplishing this are well known for example, see Gray and Meyer, Analysis and Design of Analog Integrated Circuits, 2nd edition, pages 733–735 and FIG. 12.28, the contents of which are incorporated by this reference. In this text description is provided of so-called VT (thermal voltage)-referenced current sources. By providing in such a circuit a resistor with an appropriate temperature coefficient, an output current, Io, is provided that increases with an increase in temperature of the driver chip.

Boundary Scan Testing

Figure 7:
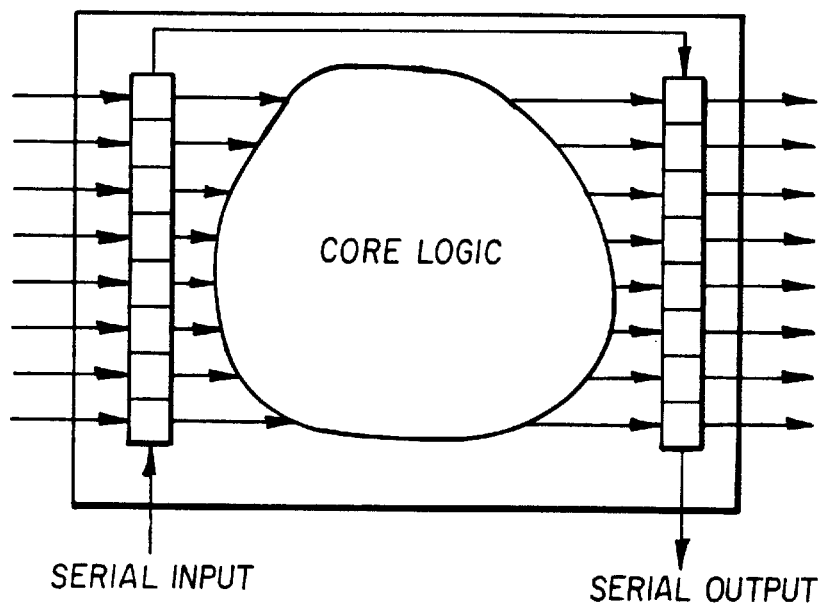
FIG. 7 is a conceptual drawing of boundary scan registers as known in the prior art.

The concept of boundary scan testing was proposed many years ago and successfully implemented by several IC manufacturers in various forms. The basic concept is simply to isolate the inputs and outputs of a device from the internal or "core" logic. This idea is shown generally in FIG. 7. It involves adding a boundary scan cell between each input and output and the core logic. These cells form a shift register "ring" around the periphery of the chip which can be loaded and unloaded serially, as well as in parallel. the operation and structure of these cells will be discussed shortly.

Several basic functions can be performed using boundary scan:

1. Data can be shifted in and out of the boundary scan register via the serial input and output pins.

2. The core logic can be tested in isolation from the primary inputs and outputs of the device, which is referred to as an "internal" test. Data is applied to the core and responses are captured via the boundary scan register. This requires shifting in data to be applied to the inputs of the core logic and shifting out the responses from the outputs of the core logic. Since new data can be shifted into the device while old data is being shifted out, both operations can be performed in one step.

3. The core logic can also be ignored to facilitate testing of the interconnect from one device to the next. The primary outputs of the device are driven from the boundary scan cells and the values on the primary inputs are captured into the boundary scan cells. This is referred to as an "external" test.

Figure 8:
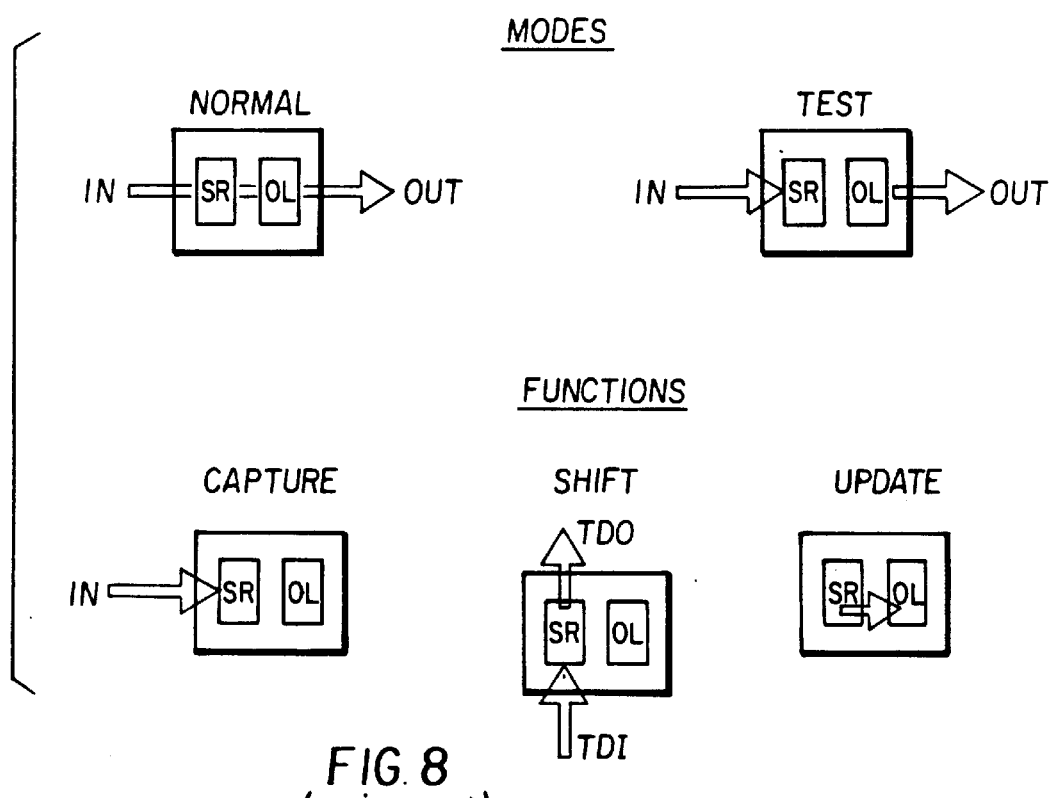
FIG. 8 is an illustration of operation of a cell in a known boundary scan register.

With reference to FIG. 8, the individual boundary scan cells which comprise the register can perform three basic functions, in two basic modes. Each boundary scan cell is comprised of a shift register cell flip-flop (SR) and an output latch or flip-flop (OL).

In the normal mode, the cell is transparent such that the output data is identical to the input. In the test mode, the output of the cell is driven by the value in the output latch (OL). The capture function allows data to be latched into the shift register flip-flop (SR). The shift function causes data on the serial input of the cell to be latched into the SR. This allows data to be shifted when the cells are connected in a chain. The update function results in the data from the SR to be latched into the OL. Each of the three functions can be performed in either of the two modes, yielding many useful functions.

Figure 9:
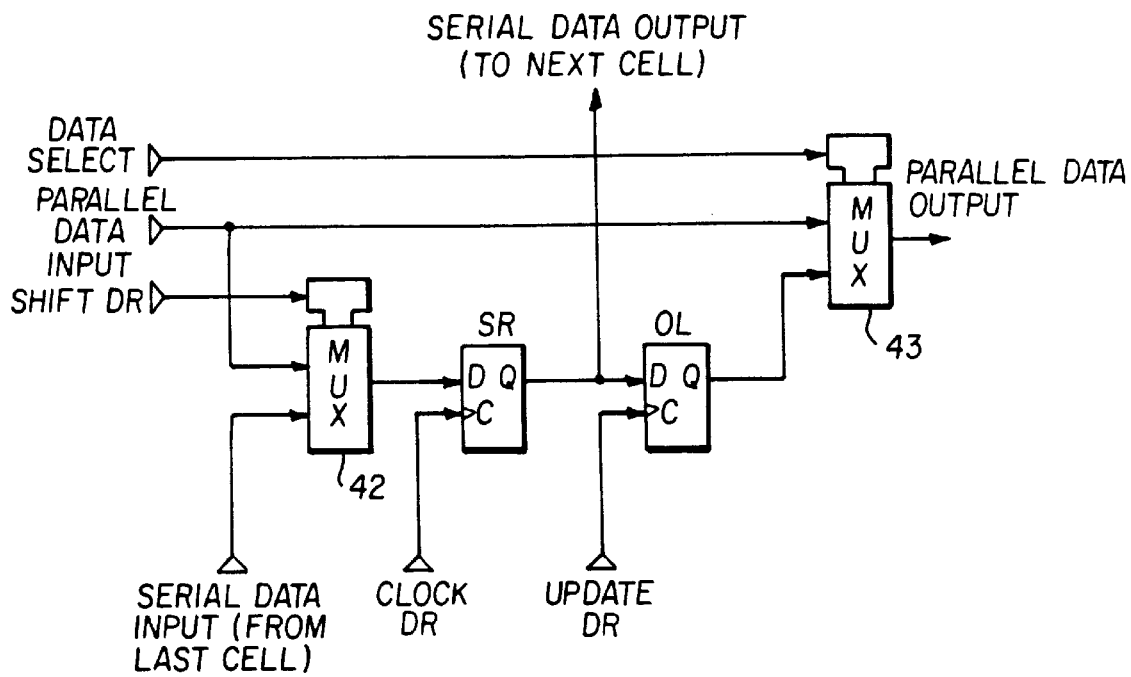
FIG. 9 is an example in block diagram form of one form of circuit that is suited for operation as a cell in a boundary scan register as known in the prior art.

An example of a boundary scan cell is illustrated in FIG. 9. As may be seen in this figure, data may be either input from a parallel data input pin or a serial data input pin (from a prior cell) to a multiplexer 42. In response to an active Shift DR signal, the data from one of the lines is input to the input of flip-flop SR. In response to an active Clock DR signal at the clock input of SR, the data is output to the output of flip flop SR. This data may be shifted into the next shift register cell or held for parallel output via the output latch. Upon an active Update DR signal being provided to the output latch OL, the data is transferred via multiplexer 43 to the parallel data output pin of the cell. Note that in the "normal" mode of operation as noted above, the cell is basically "transparent" to the data signal and thus in response to a data select signal being input to multiplexer 43, data at the parallel data input pin is output to the parallel data output pin directly.

For testing of interconnect, an "external" test is performed, reducing the board to nothing more than a mass of interconnect which can be driven and sensed via the boundary scan cells. For testing of the core logic of individual components, an "internal" test is performed, effectively isolating the core from the rest of the circuit. A "sample" operation is also available with boundary scan, allowing the circuit to function in its normal mode while data is captured into the boundary scan cells and shifted out. Such a function requires the test logic to be fully independent from the functional logic.

Prior to standard IEEE 1149.1, no standard existed to allow standard and ASIC components from different manufacturers existing on one board to employ the same implementation of boundary scan. A need was identified by several manufacturers to standardize a test port for ICs to consolidate the number of test pins and provide a common protocol for control of the test logic. The original JTAG specification was eventually proposed to the IEEE as a standard and was ratified in February, 1990, as IEEE 1149.1.

Figure 10:
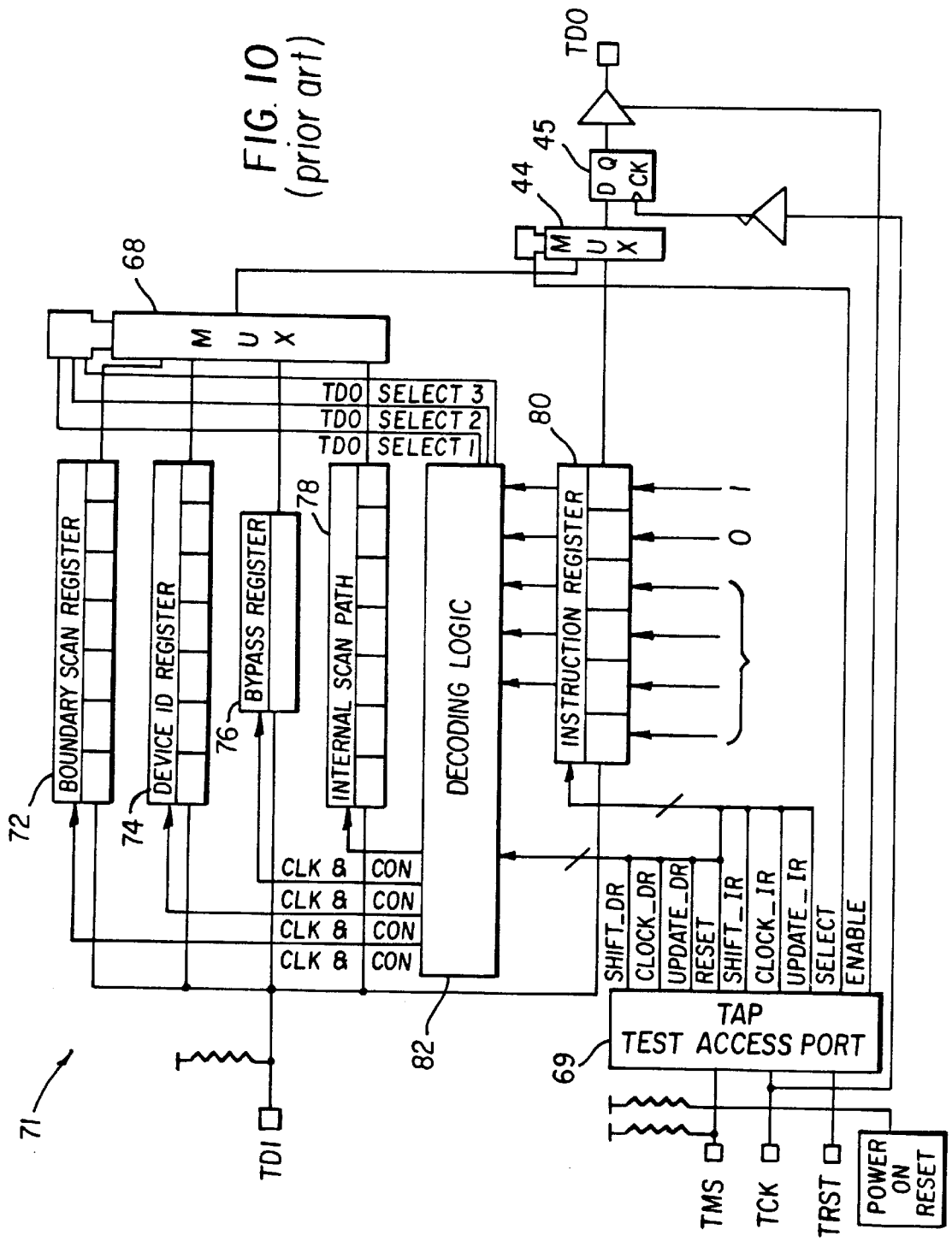
FIG. 10 is a block diagram illustration of a known circuit of IEEE 1149.1 architecture for testing connectivity of elements on an integrated circuit.

An example of implementation of the basic architecture 70 for the standard is shown in FIG. 10. This diagram represents only the test logic on a device. There are four input pins and one output pin shown. The TMS, TCK, and TRST inputs apply to the Test Access Port Controller 68 (TAP). The TAP Controller 68 is a known-type of state machine which controls access to all test logic in the device. The TDI (Test Data In) pin is a serial data input which is connected in parallel to the serial inputs of all the registers in the test logic. The TDO (Test Data Out) pin is a serial output pin which is derived from any one of the registers in the test logic, via a multiplexer 44. Registers 72, 74, 76 and 78 are multiplexed by multiplexer 69 to provide an output of one of the registers to the multiplexer 44 under control of signals from the decoding logic which in turn receives coded instructions of data from the instruction register 80. The output of the multiplexer 44 selects the output of the data in the instruction register or the register selected by multiplexer 68 in accordance with a signal from the TAP Controller. the The TMS (test mode select) is a signal that causes the TAP Controller to move through its states. TCK (test clock) is a clock input to the TAP Controller which clocks all the JTAG test logic. TRST (test reset) is an asynchronous reset signal to the TAP Controller. TRST may be optional if there is a power-up reset function built into the device to reset the test logic.

The boundary scan register 72 is shown out of context at the top of the figure. Each stage in this register is one boundary scan cell in the path of an input or output pin on the IC device which incorporates this IEEE 1149.1 boundary scan circuitry. The parallel data inputs and outputs to the boundary scan register cells are not shown here but would typically be present to provide operation in the "normal" mode. A device ID register 74 is shown next. The ID register is an optional register which contains a hard coded value that uniquely identifies a component to be read from the device. The ID register allows, through detection of the unique code, for determination that the correct device has been mounted on the circuit. The bypass register 76 is a simple single bit shift register used to shorten the data path through the device, when no particular test function is being performed on that device. It has no parallel output and is used to pass data through the device with a single TCK when selected so that the amount of shifting of data to or from another device in the scan path is kept to a minimum. The internal scan path register 78 shown is an example of a user-defined data register which can be used to access an internal scan path for device testing. The instruction register 80 allows specific codes to be shifted in to control the behavior and selection of a particular one of the data registers. The instruction register is very similar to the boundary scan register in that it contains a "shadow register" to prevent the parallel outputs from changing while data is shifted through the register. Since the instruction register (IR) is a dual register, the parallel outputs do not change state during the shifting of an instruction. The parallel outputs change state when an Update-IR state is entered in the TAP after the instruction code has been shifted into the IR.

The decoding logic 82 is a block of combinational logic which is used to decode the instructions shifted into the instruction register. This block determines which data register is selected and how the data register control signals from the TAP Controller are applied to each data register. As may be seen in FIG. 10, the TAP Controller has one set of clock and control signals for the IR and an analogous set to be used for all the data registers. These clock and control signals are to be applied to only one data register at a time so the decoding logic must direct the signals to the appropriate register. At the same time, it also must make sure that the control signals to the de-selected data registers are in appropriate states. The decoding logic is strictly combinational logic and responds to whatever instruction is present on the parallel outputs of the IR. Examples of standard instructions include a BYPASS instruction which has a code of all 1's. Such a code selects the bypass register and allows data entering the TDI input to shift through the single bit bypass register quickly to be output from TDO output terminal to reach other devices in the scan chain.

Another standard instruction is for an EXTEST (external test) wherein the IR code is all 0's. This selects the boundary scan register and allows interconnect between devices to be tested. Still other codes may be provided such as a Sample/Preload instruction that selects the boundary scan register. This allows data on parallel inputs to be sampled and the boundary scan register to be preloaded with specific data. Still other codes include an INTEST instruction that selects the boundary scan register. This allows core logic to be tested via serial data through the boundary scan register.

The TDO pin is derived from the serial output of one of the data registers or the instruction register. This pin is required to change on the falling edge of TCK, unlike everything else in the test logic. The D-flip/flop 45 shown on the TDO output is clocked on the falling edge of TCK to implement this feature. The intent of this rule is to provide race-free operation of the shift register from one device to the next. The TDO pin is also a three-state output, which is only enabled when data is being shifted out of the pin.

Driver Chip Architecture

Figure 11:
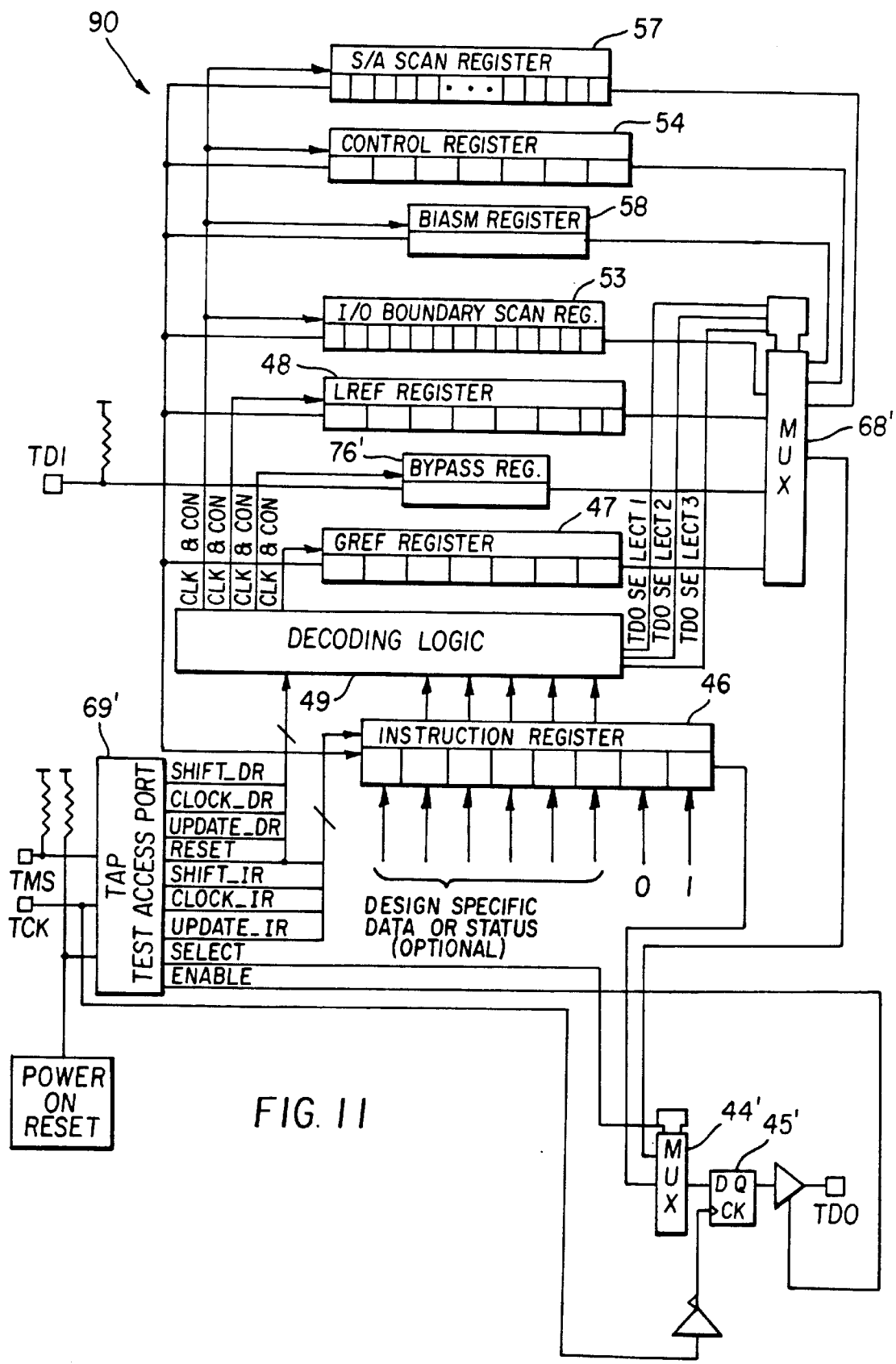
FIG. 11 is a block diagram illustration of a portion of the driver chip of FIG. 5, illustrating the IEEE 1149.1 architecture implemented in accordance with the invention.

A schematic of a portion of a printhead driver chip or IC 40 having a circuit defining an IEEE 1149.1 architecture will be described with reference to FIG. 11. In FIG. 11, there is illustrated various registers which are controllable by the TAP Controller 69' which as noted above is a state machine that changes states in accordance with a preprogrammed logic in accordance with the order of signals to its inputs. As may be noted in comparing FIGS. 10 and 11, the JTAG driver chip architecture 90 adds to a minimal IEEE 1149.1 architecture separate 8-bit LREF and GREF registers 48, 47, respectively, a signature/analysis (S/A) scan register 57, a control register 54, and a BIASM register 50. The internal scan path register and device ID register are not provided for in the specific implementation illustrated in FIG. 11.

The GREF register 47, see also FIG. 6A, is a dual register; i.e., each cell has an SR and OL combination as described with reference to FIG. 9 so that its outputs do not change until the TAP Controller 69' enters the Update DR state. The GREF register stores an 8-bit binary weighted value which determines a global current regulating control value of the writer. By global, it is meant that each of the driver chips on the printhead will have its respective GREF register loaded with the same GREF data value. On reset of this register, the parallel outputs are all digital 1's. The identification of the GREF register is provided by a digital instruction which is input serially via the TDI input pad to the instruction shift register 46. This instruction which identifies the GREF register is then output in parallel to the decoding logic 49 which then decodes the instruction and enables the GREF register. Data is then input serially via the TDI input pad to the GREF register of each driver chip. The LREF register 48 is a similar type of register and is loaded in similar fashion as the GREF register except that each driver chip on the printhead can receive different data values in its LREF register. On reset, the same value can be placed in each of the GREF and LREF registers in all the driver chips such as decimal 128. The 8-bit LREF value determines the local; i.e., for each chip individually, current regulating control value for the chip.

Values for GREF and LREF may be stored in flash memory 41 on the interface board. As noted above, values of LREF are determined to be changed by periodic testing of the current in the extra current generating circuit 152 (FIG. 5) of each chip; i.e., bias monitor mode BIASM. In response to analysis of the current in the extra current generating circuit of each chip, the MEC 50 determines if a new value for LREF is to be provided and loaded into the LREF register 48 of that chip to alter the current for driving the LEDs during the next pixel line recording period (main scan direction). The MEC provides a signal to the flash memory to download a new value to the chip determined to require a change in its current control, The IEEE 1149.1 architecture, when integrated into the driver IC as described herein advantageously supports the concurrent loading of pixel or image exposure data with IEEE 1149.1 register loading. In particular, it is thus possible to load GREF and LREF IEEE 1149.1 registers 47, 48 during the exposure clocking cycle for recording corrected pixel image data without causing the alteration of levels of electrical current in the channels for recording the pixels presently being recorded. The reason that the new LREF and GREF data does not affect electrical current levels for the pixels presently or currently being recorded is that the marking engine controller ensures through signals to the TAP Controller 69' that the UPDATE-DR signal will not be entered until the exposure clocking cycle for recording the current row of pixels presently being recorded is complete. The loading of the IEEE 1149.1 data registers such as GREF and LREF can also occur concurrently or at the same time as the next line of corrected pixel image data is being loaded into the driver chips' data registers 24 since the GREF and RREF signals are clocked in through the TDI–TDO lines which are separate and independent of the image data bus upon which the corrected image data is being carried.

Figure 16:
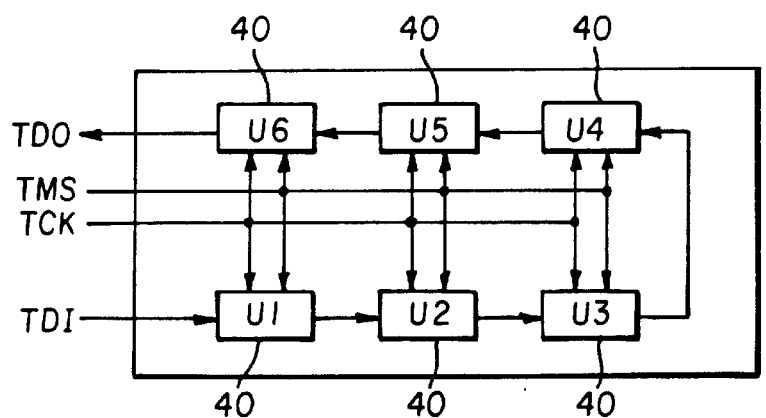
FIG. 16 is a schematic illustrating a series connection of six JTAG architectured driver chips.

With reference to FIG. 16, there is illustrated a serial interconnection configuration of driver IC chips U1–U6. Only 6 driver chips 40 are shown to illustrate the nature of serial interconnection on the printhead using the TDI and TDO lines of these JTAG devices; however, it will be understood that on a printhead there is likely to be many more of these devices interconnected in accordance with the serial interconnection scheme to be described although other connection schemes may be used such as serial/parallel, for example . TMS and TCK lines are wired in parallel to each device. This implies that all these JTAG devices will operate in concert through TMS and TCK signals applied in concert to their respective TAP Controller state machines. All devices connected in this manner will always be in the same state of the TAP Controller at a given time. However, this does not mean that each device must have the same instruction loaded at the same time.

For example, in order to test driver chip U4 internally, the proper instructions are first scanned and loaded into the instruction registers of all the devices (U1–U6) and then signals are applied to the TAP Controllers to cause these controllers to output signals to the decoding logic devices and instruction registers to scan data into and out of the data registers. Initially, the TAP Controllers on all the driver chip devices go to the Shift-IR state and begin scanning in data from TDI. The bit stream contains the code for INTEST in the proper position for the instruction register of U4, while the code for the BYPASS instruction is placed in all the instruction registers 46 for the other devices. After the instructions are updated, the scan path consists of the bypass registers of U1, U2, U3, U5, and U6, and for example, the boundary scan register 53 of U4. To scan data into the boundary scan register of U4, all the TAP Controllers go to the Shift-DR state and begin scanning in data from TDI. The path from U1 to U3 is comprised of 3 bypass registers, making it 3-bits long since the bypass register of each device is only of 1-bit size. The length of the path through U4 is the length of its boundary scan register, and the path through U5 and U6 is 2-bits long for the two bypass registers. Once the data is scanned into the entire chain, the boundary scan register is updated causing the data to be applied to the internal logic of U4. To observe data from the internal logic, all the TAP Controllers go through the Capture-DR state and capture data into the data registers. Those devices which have the BYPASS instruction loaded capture a 0 into their bypass registers, while the outputs of the internal logic on U4 are captured into U4's boundary scan register. The Shift-DR state is then entered to shift out the observed data. These two operations of observing responses and applying data can be combined since data can be shifted out at the same time new data is shifted in. The TAP Controller state machine lends itself to this since a capture operation is always performed before a scan followed by an update operation. For an internal test, the data shifted in becomes the new input stimulus while the data shifted out would be the output response resulting from the previous data shifted in as input stimulus.

The interconnection of JTAG devices on a board forms a four or five line serial test bus which is under the control of the marking engine controller (MEC). The MEC handles the low-level toggling of TMS and TCK and provides data for TDI, and accepts the data coming from TDO. Alternatively, the data may be provided from the flash memory in accordance with instructions provided by the MEC and data may be provided to the flash memory as well using the transceiver chip.

Figure 17:
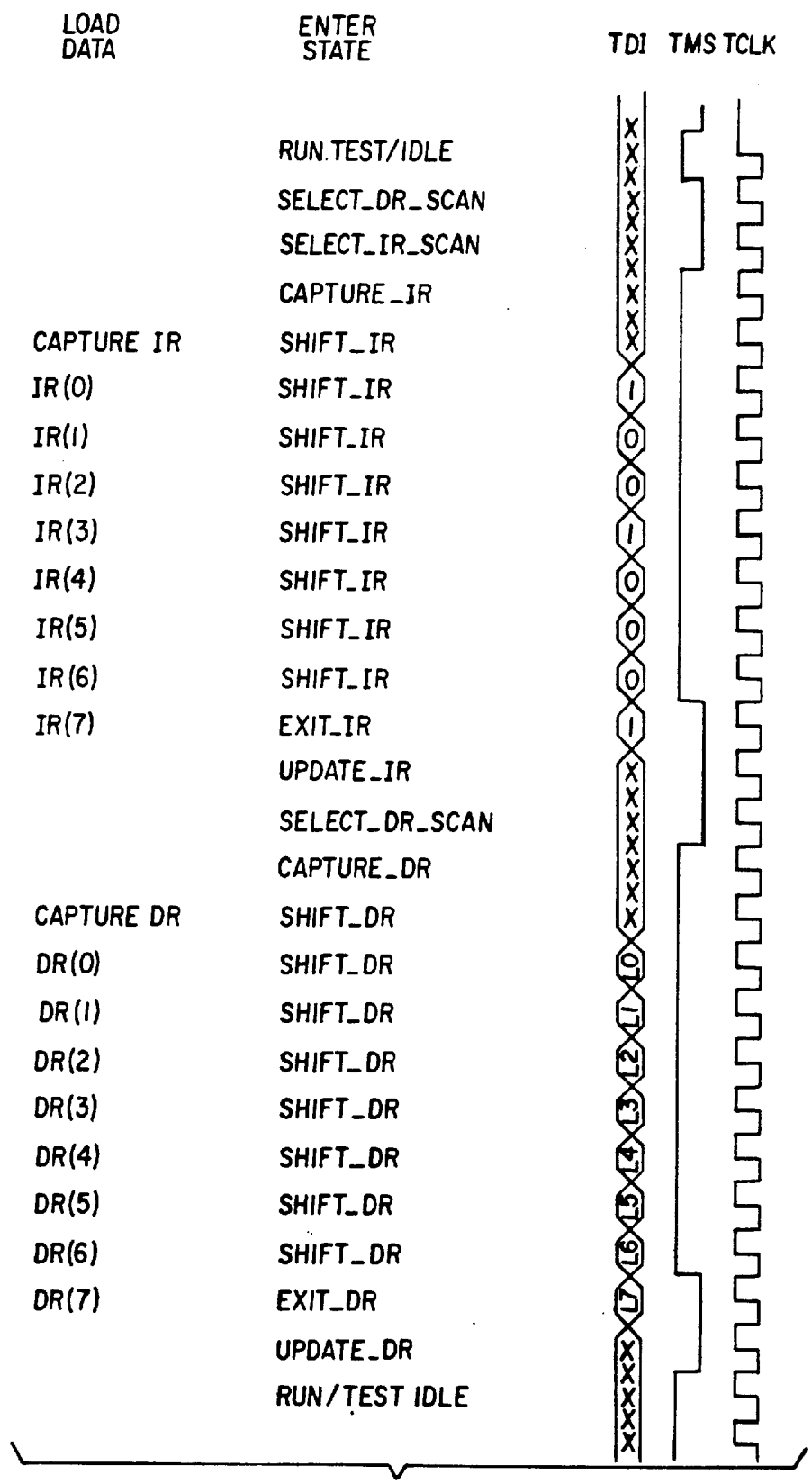
FIG. 17–19 are timing diagrams illustrating signal input to a TAP Controller for loading particular data registers shown in FIG. 11.

In FIG. 17, there is provided a timing diagram for loading a set of current control data into the LREF register. A signal on the TMS input to the TAP Controller places the instruction register of the particular IC chip 40 that is to be loaded with this LREF value into the Capture-IR state. The instruction register is then loaded with the code for the LREF register which is shifted from the TDI input into the instruction register in response to clock pulses from the TAP Controller. A signal on the TMS line then provides a signal to the TAP Controller which changes the state of the instruction register to the UPDATE-IR state wherein the coded instruction stored in the instruction register is now output to the decoding logic which in response to clock controls and to the output state of the TAP Controller selects the LREF register for placement of this data register into the Capture-DR state. Data for LREF is then shifted into the TDI input into the LREF register under clock control of the TAP Controller. This may be done simultaneously while image data is being sent on the image data bus and being latched in the data latch registers in response to the token bit. Although the token bit enters the chip in one of the boundary scan register cells, it does not enter in normal operation via the TDI input line. After the current recording period is over for recording a line of pixels during a main scan line recording period an Update-DR signal is provided by the TAP Controller. This causes the output of the LREF register to be used in the control of the transistors to affect current regulation of the current control circuit 23 illustrated in FIGS. 6A–C during the next or subsequent main scan line period for recording the next line of pixels. The UPDATE-DR instruction is provided when ever it is desired to cause a change in the output of the LREF register.

Figure 18:
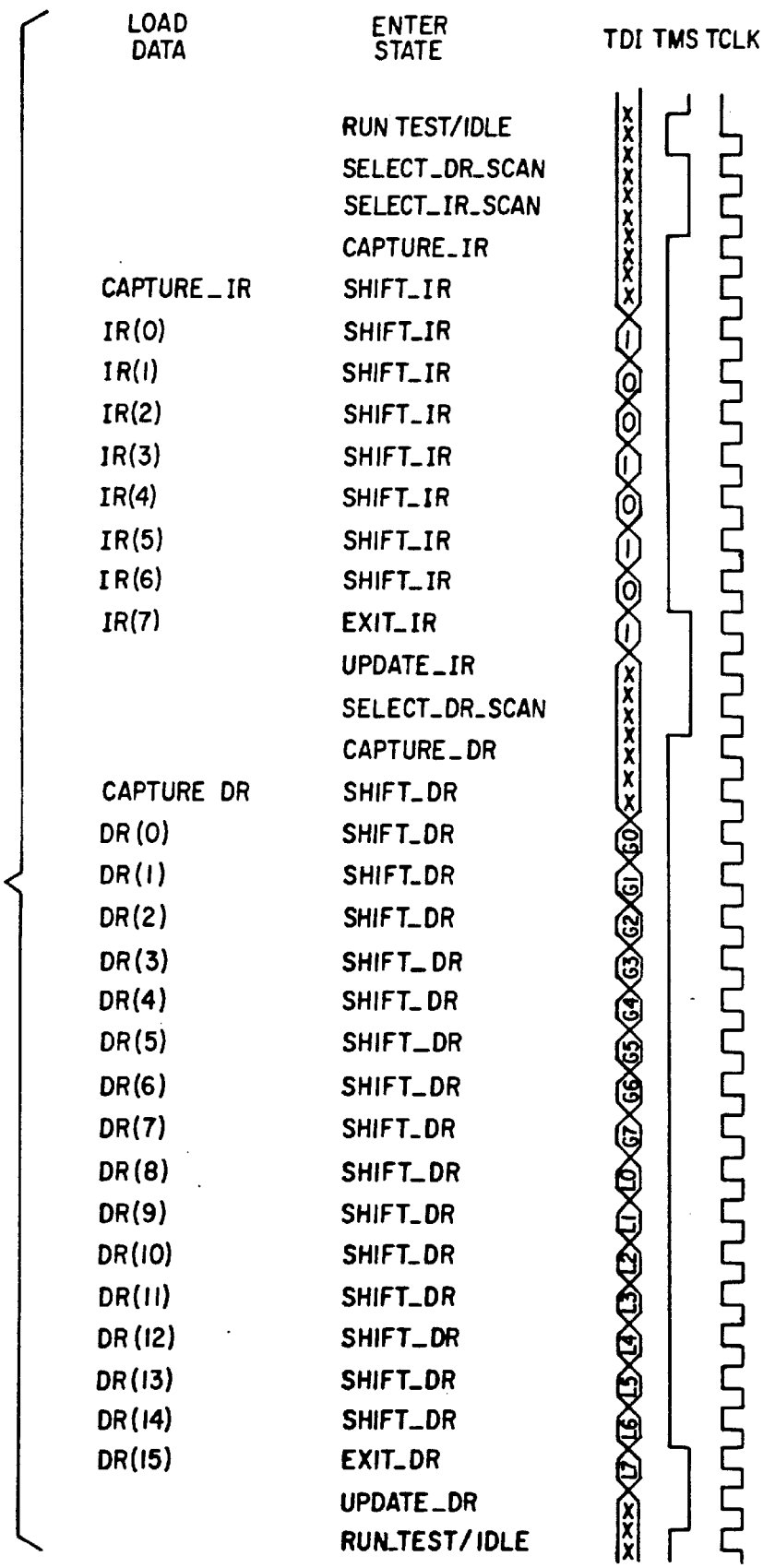

In FIG. 18, there is illustrated a timing diagram wherein signals for loading both registers LREF and GREF as a single combined register is illustrated. By having different instruction register (IR) codes respectively for LREF and GREF as separate registers and a third IR code for LREF and GREF as a combined register, one can provide either register with update data or at the same time update both registers simultaneously.

The BIASM register 58 is also a dual register, but of single bit size. When this bit is set, i.e., digital 1 at the parallel output, the bias monitor channel, i.e., the constant current driver 23' of the extra current generating channel 152 (FIG. 5) for the driver IC is enabled. On reset, the parallel output of this register is set to 0. Upon enablement of the bias monitor channel in a particular driver chip, the extra current generating channel generates a current that is slaved to the current in the master circuit. Because the constant current driver circuit 23' in the extra channel 152 is similar to that of the other driver channels 23, the current in the extra channel provides an indication of the current driving ability of the regular driver channels. As used herein, the term slaved implies that the current in a slave channel is equal or a constant proportion or other predetermined relational value of the current in the master channel. This BIASM current is then output to the interface board via line 37 wherein the A/D converter 51 digitizes same and inputs a corresponding value to the flash memory 41. The values of the BIASM currents from each of the driver chips is stored in the flash memory and downloaded to the MEC 50 for determining a need to update GREF data to the driver chips.

Figure 19:
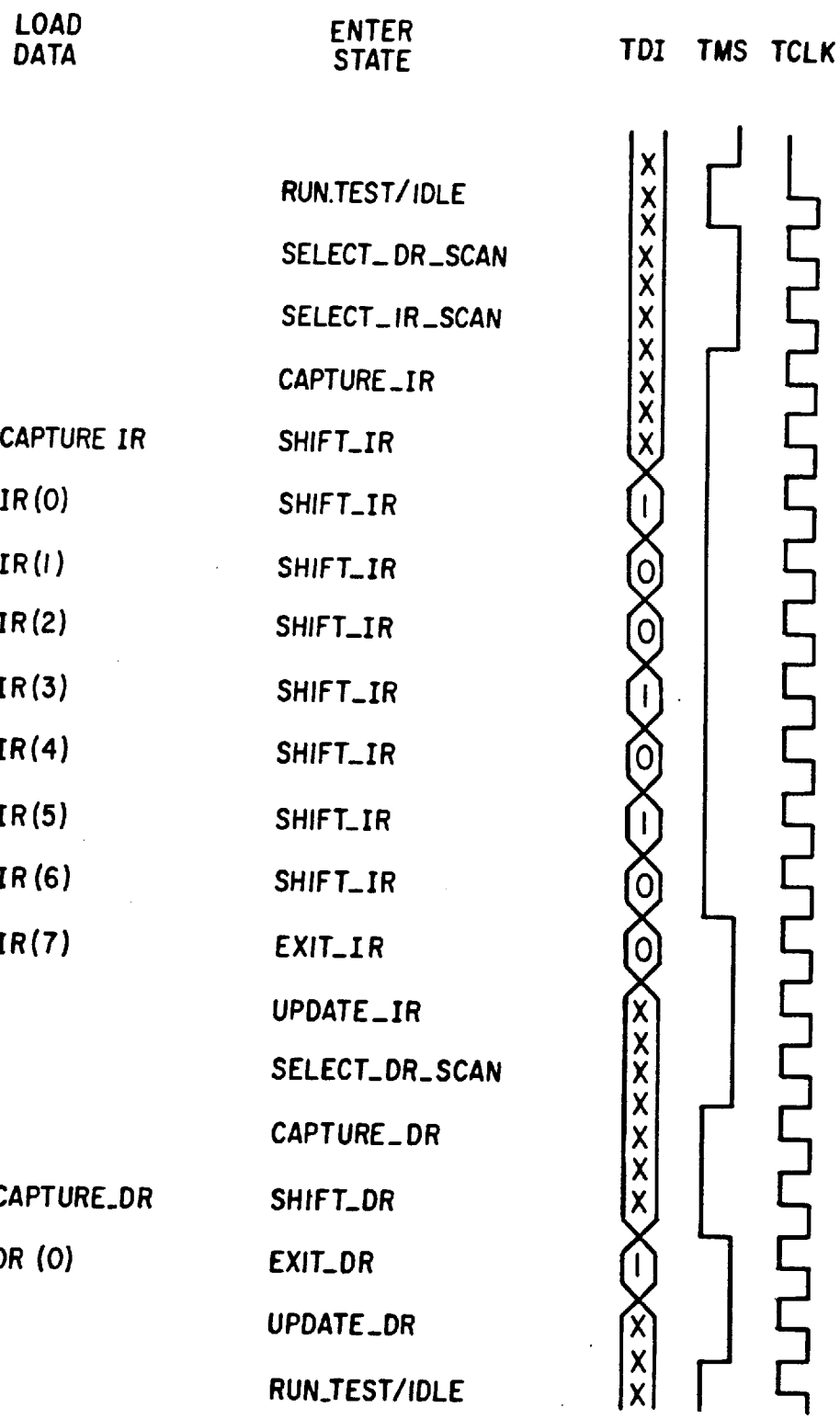

FIG. 19 is a timing diagram for loading an enablement bit into the single bit data register of the BIASM or bias monitor register 50. The timing diagram of FIG. 19 is similar to that of FIG. 17 except that the instruction register is loaded with the code of the BIASM register and only a single bit of data such as logic 1 is provided. This bit is captured in the BIASM register of the appropriate driver chip and upon an Update-DR state change of the TAP Controller, the enablement bit in the register enables the extra-current generating channel in this driver chip.

As noted above, inputting of data into a particular driver chip for controlling the normal operation of that driver chip is provided using instructions to each of the other driver chips that enables their respective bypass registers and places the register with data to be changed into a capture -DR state so that the control data being used to record the current line of pixels is shifted out and through all the downstream driver chips through their BYPASS registers. New data is also being provided and shifted through the bypass registers of upstream driver chips to the data register to receive the new control data. After the exposure period for the current line of pixels or when it is desired to begin recording using the new control data, an update instruction is provided by the TAP Controller in response to a signal on the TMS line.

The I/O (Input/Output) boundary scan register 53 is a 13-bit register required by IEEE 1149.1 standard and used to verify device connectivity by monitoring inputs and controlling outputs. It may also be used to control the device inputs and monitor outputs during device testing. Each of the 13 cells in this register is associated with a different I/O (input/output) signal connected to the printhead. Thus, each of the six corrected image data lines associated with this driver chip has a respective cell. There are two token bit cells, one for each of the two token bit signals (LTOKEN and RTOKEN). A cell is also provided for a signal enabling the token bit to be shifted right to left (SHFTRTL) and another cell is provided for a signal enabling the token bit to be shifted left to right (SHFTLTR). Separate cells are also provided for the latch signal (LLATCH), the clock signal for shifting the token bit (SHFTCLK) and the exposure clock pulses (EXPCLK). Thus, a bit can be input into any of these registers to confirm connectivity of the respective line associated with the respective line, as specified in the IEEE 1149.1 standard.

The signature analysis (S/A) scan register 57 is a 64-bit register used to monitor the output of the digital portion of each of the 64 output channels of the driver IC. The comparator (19) output of each of the 64 driver channels is used to toggle a corresponding flip-flop in each S/A scan register cell on then off during a normal exposure cycle. This register can be configured as a linear feedback shift register (LFSR) which can perform signature analysis, so that during a test mode a known pattern will produce a known signature which can be shifted out via clock signals (TCK) and TAP Controller signals TMS, and TDO. This will allow verification of the digital portion of the driver IC functionality. The bits in the register correspond to their like numbered driver channel. Thus, when an LED is to be turned on in response to a signal from the output of the respective comparator, the corresponding S/A scan register's flip-flop is toggled. In one preferred embodiment, in order to provide clean edges for turning on and turning off the LEDs, the output of each comparator 19 may be used to toggle the flip-flop of the corresponding S/A scan register cell ($57^1$ . . .

$57^{127}$) (FIG. 5) which is then used to turn on and turn off transistor Q4 (FIG. 6C) of each respective channel. The control of the LEDs via the flip-flop of the S/A scan register also allows the output state of the S/A scan register to be disabled during power-up, thereby blocking power to the LEDs during power-up. In response to power-up, the control register of each driver chip is loaded with a bit at its output that disables the output state of the S/A scan register.

The control register 54 is a multibit register wherein each register cell determines modes of driver operation; e.g., 300 or 400 DPI resolution, token direction and token direction enabled. A bit in one register cell defines whether resolution operation is at 400 DPI or 300 DPI. A bit in a second register cell defines whether the right to left or left to right token direction is established for the particular chip. A third register cell determines if the token direction is disabled or enabled. A fourth register cell determines whether all of the driver channels are to be enabled or disabled. A fifth register cell provides a bit that may be used to enable the boundary scan registers to enter a test mode required to perform parallel signature analysis. Details regarding operation of each of the more important ones of these modes will be provided below.

Sampling A BIASM Value

In order to sample the current in the extra-current generating channel 152 of each driver chip, an instruction is read into the instruction registers of all driver chips on the printhead identifying the single bit BIASM register 50 which is a dual register. This instruction emanates from transceiver chip 52, such as a 74 ABT 18502 (manufactured by Texas Instruments) that is mounted on the interface board and is in response to a command from the MEC (50). Shift commands are then provided to the BIASM registers 58 of the driver chips to flush all the data currently residing in these registers by shifting the data out of these registers. Note that where the printhead includes 76 driver chips the respective BIASM registers of all the driver chips are connected as a shift register via the TDI, TDO inputs and outputs. With all the BIASM registers now clear, a digital "1" is shifted into the BIASM register of the first driver chip via the TDI input and an update instruction is provided via the TAP Controller (see FIG. 19). The digital "1" is then output to the output stage of the latch in the BIASM register 50 and enables the constant current driver 23' in the extra current generating channel 152 which as noted above is similar to the other current driving circuits on this driver chip but is not connected to an LED. The analog current generated in this extra channel is carried on common line 37 which is connected to the A/D converter 51 and is then read into the A/D converter 51 on the interface board and its value digitized in response to a command from the transceiver chip 52. After a predetermined allotted time sufficient for a conversion operation, the A/D converter receives a command to output the digitized results to a boundary scan register on the transceiver chip. The transceiver then provides a memory read command to the flash memory which receives at its address input the digitized value of the BIASM current from the particular driver chip. After reading the value of the current in the extra current generating channel of the first driver chip, the current in the extra current generating channel of the second driver chip is read by shifting a digital "1" into the BIASM register 50 of the second driver chip and a digital "0" into BIASM register 50 of the first driver chip which in response to an update instruction causes current to cease from the channel 23' of the first driver chip and current to commence from the channel 23' of the second driver chip. This current is also determined and stored in flash memory and the process repeats for each of the driver chips. After the current from the extra-current generating channel of each of the driver chips is stored in the flash memory, the value of this current with a corresponding GREF and LREF value for that driver chip is downloaded from flash memory to the MEC 50. The MEC compares these values with data representing proper operation and determines whether a global change is required; i.e., all driver chips are to have an updated GREF value, or determines whether only some driver chips are to have respective updated LREF values. Typically, where the temperature increases uniformly over the printhead as indicated by smaller currents being generated in the extracurrent generating channels, a new GREF value which is the same for each driver chip, is provided. However, where there are different temperatures on the printhead, a change in LREF to certain driver chips can be provided. New values of LREF and/or GREF are serially loaded and read back using the TDI–TDO lines to the LREF and/or GREF registers of the driver chips accompanied by appropriate instructions. When changes to GREF are made, the same instruction is provided to all the driver chips to accept the new GREF value.

Automatic Token Direction Sensing

As noted above, a standard construction method for printheads today is to align a number of driver ICs parallel to the LED array line as shown in FIG. 1 and also in FIG. 2 which illustrates a modular printhead construction discussed above. For a number of applications (higher density of LED elements—DPI, and faster throughput systems) it is desirable to have driver ICs aligned on both sides of the LED array. Since it is desirable for the logic signals to originate at one end and from that point propagate down the length of the driver ICs, this causes the signal to enter the left side of the driver IC on one row (odd numbered driver ICs) and the right side of the driver IC on the other row (even numbered driver ICs). Within the driver IC the token must then shift through the individual LED driver channels left to right, as viewed in FIG. 1 for the odd-numbered LEDs and right to left, as viewed with FIG. 1 upside down for the even numbered LEDs. This causes what otherwise would be a common part to function differently. To date this problem has been solved in two ways, first create separate parts where one shifts left to right while the other part shifts right to left. Since each parts looks extremely similar this leads to confusion in production. The second solution as noted in U.S. Pat. No. 4,746,941 is to add a direction logic signal input on the driver IC. For example, if the input is in the high state, the data or token are shifted one way within the driver IC; if the input is in the low state, the data or token are shifted in the opposite direction.

The circuitry described below self senses which direction the token will propagate through the chip. This solution does not require the extra direction input and yields one part which can be used in either driver row. Elimination of the extra input can result in reduced die size and part cost and may also result in a reduction of the number of wirebonds required in the assembly of the printhead. This solution results in a common part for devices requiring two rows of driver ICs.

The automatic token direction sensing circuit of the driver IC determines which way a token needs to be shifted in the driver IC simply by watching both the left and right token inputs to see which side has an input change first. Note that each driver IC includes two token pads one used for receiving a token signal into the driver IC and the other used for outputting the token signal to an adjacent driver IC. If the left side token input has a logic state that changes first, then the shift direction should be left to right. If the right side input has a logic state that changes first, then the shift direction should be right to left.

Figure 12:
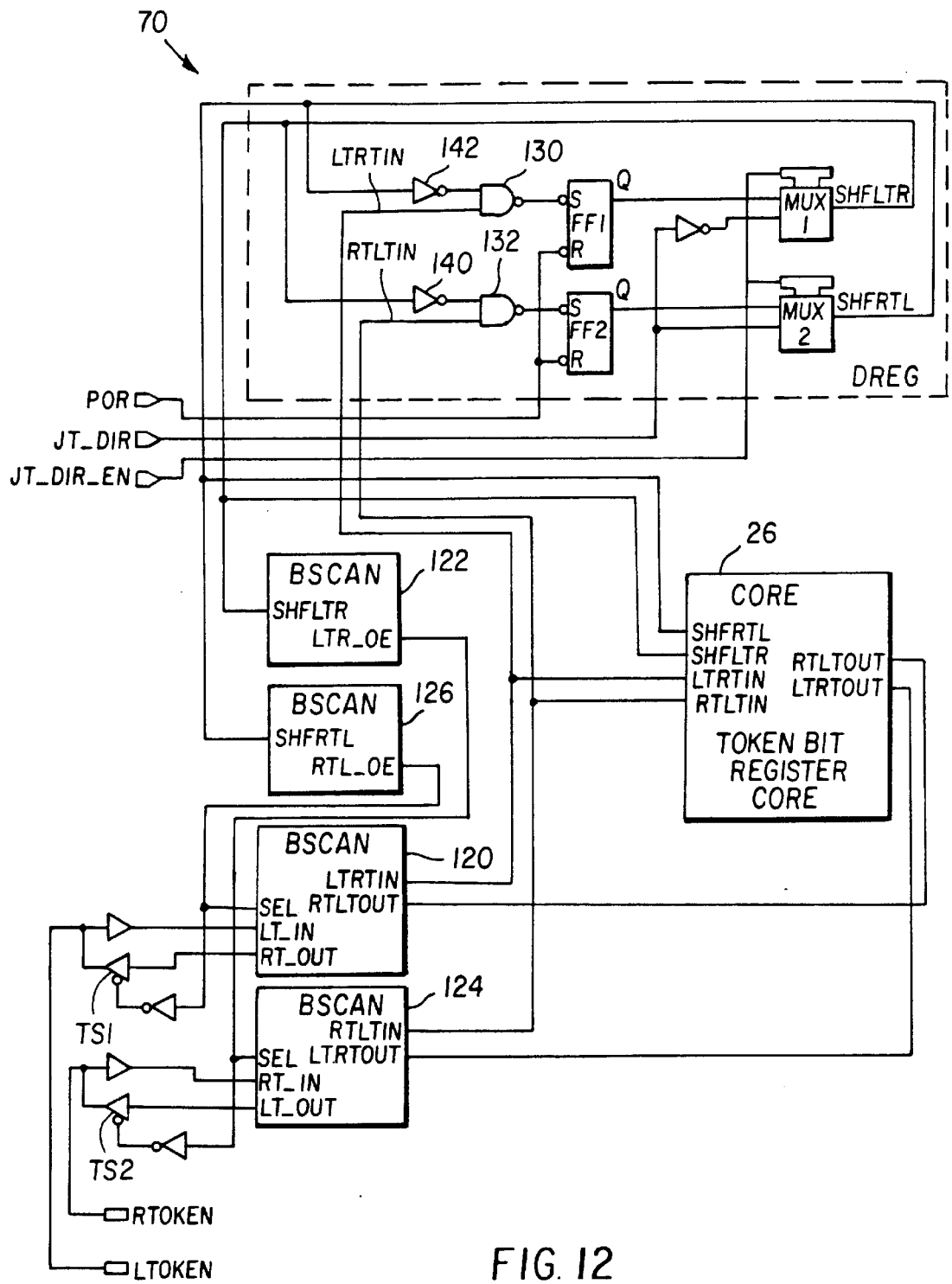
FIG. 12 is a schematic of a circuit used on the driver chip of FIG. 5 and providing automatic token direction sensing of a token signal being used for latching of image data.

With reference now to FIG. 12, details of a logic circuitry used to accomplish self-sensing of token direction are illustrated. The driver IC has an internal direction register (DREG). Upon power-up or power-on reset (POR) signal provided by the MEC (50), the direction register's (DREG) outputs (SHFLTR and SHFRTL) are both set to a logic low which causes boundary scan register cells 122, 126 respective outputs LTR-OE and RTL-OE to go low which leaves both the left token input (LTOKEN) and right token input (RTOKEN) lines with their input modes enabled while disabling the output mode on both by inhibiting operation of buffers or tri-state inverters TS1 and TS2. As noted above, the token bit or pulse is a signal that is input into a first driver chip and passes through the various channels of the driver chip until it exits and is input into a second driver chip. This process repeats for the second, third, etc. in accordance with the number of driver chips having access to the same data bus. When a token pulse (high) is received first on LTOKEN, the shift direction is established as follows: the signal LTOKEN is shifted into and sets the LTRTIN line high of boundary scan register cell 120. This causes the NAND gate 130 output to go low feeding into the S input of the SR flip flop or latch (FF #1) which then causes the SR flip flop's Q output to go high and feeds into the multiplexer (MUX #1). Change in state of the flip-flop or latch may additionally be under control of, as is well known, of clock pulses that are provided to a clock input of these devices. In the normal mode of operation the multiplexer output state matches the Q output of the SR flip flop and thus SHFLTR goes high. SHFLTR high causes the output line of boundary scan register cell 122 LTR_OE to go high which enables the RTOKEN line to function as an output only by causing its boundary scan cell 124 SEL input to go high thereby establishing directional operation of the cell 124 for left to right shifting of the token bit between LTRTOUT and LT-OUT and enabling the buffer circuitry (TS 2) on the output to RTOKEN. The SEL input for cell 124 when set to logic high does not allow signals input to terminal RT -IN to be output from the cell 124. When the buffer circuitry (TS 2) is enabled, signals output from the LT-OUT terminal of cell 124 are allowed to pass through the buffer circuitry to the RTOKEN line. In addition to this, when SHFLTR goes high, it feeds back through an inverter 140 to one input of a NAND gate 132 in the RTOKEN side of the DREG. This low input to the NAND gate 132 locks out the RTOKEN side of the DREG and prevents any signals or noise from causing the driver IC to switch shift direction at a later time.

The token bit register "core" logic 28 represents the 64 token registers of the driver chip wherein SHFRTL and SHFLTR represent control lines carrying signals that serve to establish the direction of shifting within the driver IC (see also FIG. 14), and LTRTIN and RTLTIN represent the lines carrying the token bit signal into the core 28 of the token shift register which core in the example of this driver IC includes 64 token bit registers. As will be described below with reference to FIG. 14, the lines SHFRTL and SHFLTR are used to enable and disable certain buffers to control direction of shifting of the token bit in the driver chip. The process by which right to left shift direction control with automatic sensing of token direction is similar. Assume, as noted above, that upon power-up or power-on reset the token bit input modes of registers 120, 124 are both operational with their output modes disabled. When a token bit pulse (high) is received first on the line RTOKEN and after amplification input at the RT_IN input of the boundary scan register cell 124 the shift direction is established by RTLTIN at the output of boundary scan register cell 124 going high. This causes the output of NAND gate 132 to go low. The output of NAND gate 132 is input to the S input of SR flip flop or latch FF2. The SR flip flop's Q output then goes high and is input to the multiplexer MUX #2. In the normal mode of operation the output state of MUX #2 matches the Q output of FF #2 and thus line SHFRTL goes high. A high level signal on SHFRTL causes the output line RTL_OE of boundary scan register cell 126 to go high which enables LTOKEN to function as an output only by causing its boundary scan register cell 120 SEL input line to go high, thereby establishing directional operation of cell 120 for right to left shifting of the token bit between RTLTOUT and RT-OUT and enabling the buffer circuitry (TS1) on the output to LTOKEN. The SEL input for cell 120 when set to logic high does not allow signals input to terminal LT-IN to be output from cell 120. When the buffer circuitry (TS 1) is enabled, signals output from the RT-OUT terminal of cell 124 are allowed to pass through the buffer circuitry to the LTOKEN line. In addition, when SHFRTL goes high, it feeds back through an inverter 142 to one input of the NAND GATE 130 in the LTOKEN side of the direction register DREG. The inverter's low input to NAND gate 130 locks out the LTOKEN side of the direction register and also prevents any signals or noise from causing the driver IC to switch shift direction at a later time.

Figure 15:
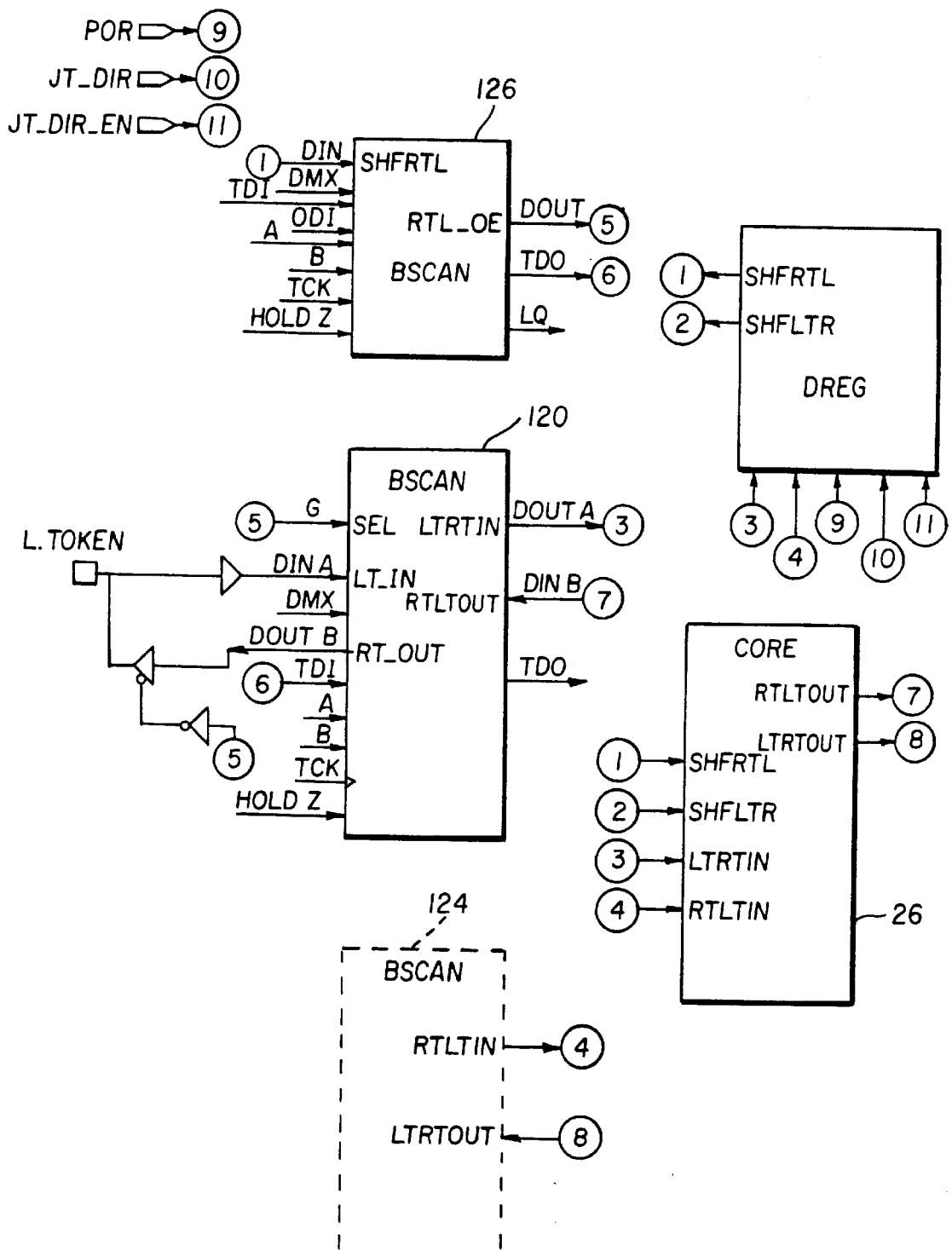
FIG. 15 is a schematic of a portion of the circuit shown in FIG. 12 and showing additional signal lines associated with IEEE 1149.1-type cells.

In FIG. 15, there is shown in greater detail with regard to input and output of signals, a schematic of the JTAG boundary scan cells 126 and 120 and the direction register DREG and core logic 26 that form a part of each driver chip 40. Boundary scan cell 126 may be embodied as a known TSOOOLJ uni-directional SCOPE (trademark of Texas Instruments, Dallas Tex.) cell whereas boundary scan cell 120 may be embodied as a TSBOOLJ bi-directional SCOPE cell. In FIG. 15, input-output lines associated with each of the components have indicators for the JTAG designated inputs and for the functional inputs that the signals represent in the particular circuit of FIG. 12. For example, the signal LTOKEN representing the token bit is input on line DIN A into boundary scan cell 120. The term DIN A is the manufacturer's identifier for one of the data input lines to a TSBOOLJ cell. Equivalently, this input is also indicated as LT_IN which corresponds to the term for this line in FIG. 12. It will be noted that the manufacturer's designation for each line is provided outside of the cell while the functional identifier for the line as assigned in the schematic of FIG. 12 is located inside of the cell. To facilitate understanding of the connections between cells 126, 120 and DREG and the core 28, the lines are not shown connected but instead common connections are indicated by circled numbers wherein the same circled numbers represent a common connection.

In the manufacturer's identifier terms, lines A and B are mode-select input lines with each providing a control signal for a SCOPE cell function. The DIN lines are system data input lines for input of system data. The DOUT lines are system data output lines operating such that when in a system mode they pass data residing on the respective DIN line. In the test mode, a DOUT line passes a test data bit. The DMX lines operate as a data output mux control and determine whether test or system data appears on DOUT. HOLDZ is a test output latch enable line. At one binary level, the output latch of the cell remains in the current state. When at a second binary level, the output latch of the cell is loaded with the current state of an internal input register that comprises a part of the cell. TCK is a test clock input that provides a high-active clock input for the input register with data selected by control signals A and B. The TDI line is a test data input line that provides a serial scan data input from a prior cell's TDO output line. The TDO line is a test data output line that provides serial scan data output for a subsequent cell's TDI input line.

Token Direction Control

In addition to the automatic direction sensing circuitry for determining direction of token shifting, there is also provided an alternative ability to force the shift direction via the IEEE 1149.1 interface to provide for more flexibility in use of this driver IC chip. In the above description, it was noted that an instruction into the instruction register 46 (FIG. 11) allows selection of the control register 54. One of the bits of the control register (for example, bit 2) determines the shift direction, while setting a high state to bit 3 of this control register causes the direction set in bit 2 to override the automatic token direction sensing circuitry described above. Referring again to FIG. 12, the state of the JT_DIR_EN line (set by bit 3 in the control register) controls the two multiplexers (MUX #1 and MUX #2) in the direction register (DREG). When JT_DIR_EN is high, the two multiplexers ignore the SR flip flop (FF1 and FF2) outputs. The states of the SHFLTR and SHFRTL lines are determined by the state of the JT_DIR line; if a signal on the JT_DIR line is high the SHFRTL line goes high while the SHFLTR line goes low. The state of JT_DIR is determined by the control register bit 2 state. The impact on the boundary scan cells 120, 122, 124, 126, and the LTOKEN and RTOKEN outputs is the same as if controlled by the self-sensing circuitry described above.

At the printhead level, this design also has significant advantages. The design allows for a high level of flexibility as to where shift chains may originate and in what direction the token flows. With a token signal passing down the length of the printhead and commonly available to all driver ICs, the printhead configuration can be determined by which driver chips' LTOKEN and RTOKEN inputs are wirebonded to the TOKEN line (see FIG. 3). Assuming that the printhead is configured into four segments such as drivers for driving the lower even numbered LEDs, lower odd numbered LEDs, higher even numbered LEDs and higher odd numbered LEDs there would only need to be four driver chips at the head of each segment that is attached to the token line. The remaining chips in each segment receive the token signal from the token output of a prior chip in the same segment. This allows for as many shift chains to be formed as needed to keep shiftclock speeds down to design limits and allows whatever direction on load of data the design requires. It also eliminates the need for a wire jumper from each driver chip to a token direction line.

Token Chain with Skip Logic

Current standard resolution levels for printheads are 200, 240. 300, 400, 480 and 600 DPI. For manufacturing tooling and parts commonalty in assembly, it is desirable to manufacture LED arrays that contain 96 LEDs for 300 DPI, 128 LEDs for 400 DPI, and 192 LEDs for 600 DPI (or an equivalent ratio) as this results in LED array ICs of the same length. Presently, when the current driver IC is designed, it is designed for use with just one specific resolution. However, a single current driver IC which is capable of operating with multiple resolution LED arrays would be highly desirable.

Figure 13A:
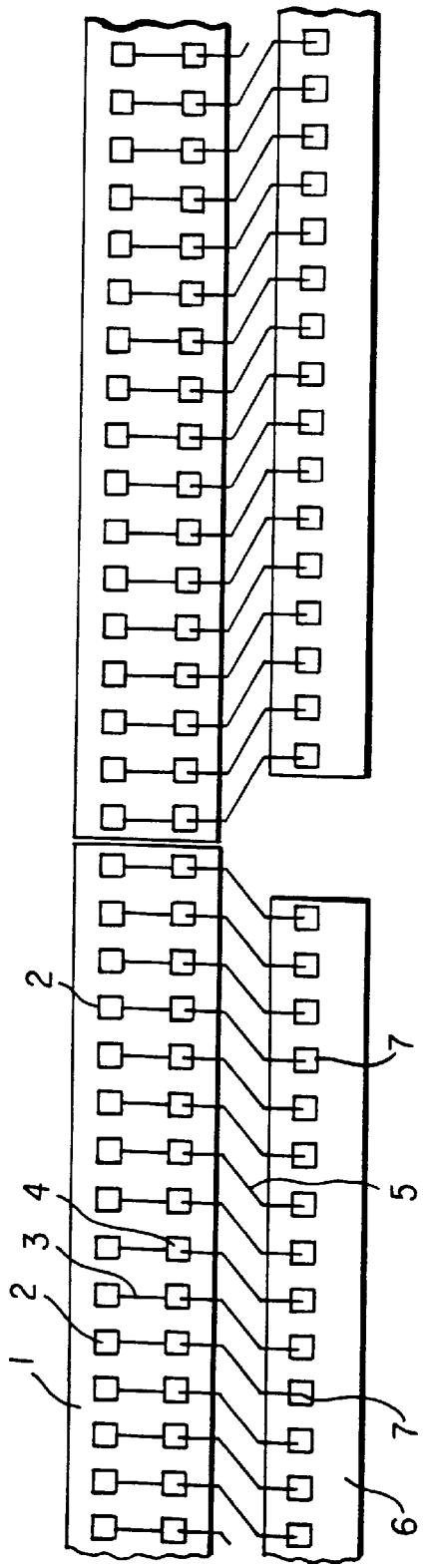
FIG. 13(a) is a schematic of a printhead illustrating driver chips of FIG. 5 having all of their respective driver channels connected to respective recording elements on LED chip arrays.
Figure 13B:
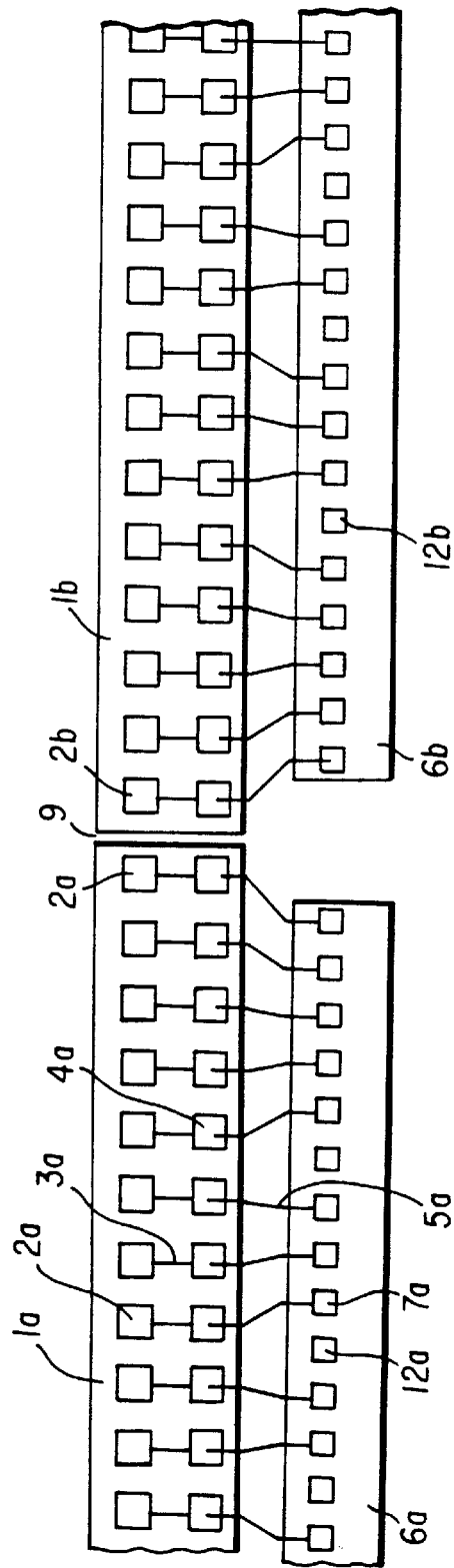
FIG. 13(b) is a schematic of a printhead illustrating the same driver chips used with lower resolution LED chip arrays wherein some of the driver channels are not used.

The driver IC chip design described herein (with driver chips on each side of the LED array) can support LED arrays with a resolution of 400 DPI (128 LEDs total). In addition, an operational mode is also provided to cause every fourth output to be skipped so that only 96 channels are active (48 in each driver chip) and a 300 DPI LED array can be also supported. Referring to FIG. 13a, the current driver IC 6 (maximum resolution of say 400 DPI has wirebond pads 7 connected via wirebonds 5 to a wirebond pad 4 to a corresponding LED 2 on 400 DPI LED array 1. The pads 7 each provide a connection terminal for outputting driver current from a corresponding IC driver channel. In the examples illustrated in FIGS. 13a and 13b only one driver chip is shown opposite each LED array to simplify the illustrations. As noted above, a more typical application has driver chips on either side of each LED array. It may be assumed that another driver chip is present and connected to say the odd numbered LEDs which are not shown. Wirebond pad 4 is electrically connected to LED 2 with a metallic trace 3 on LED array 1. The same current driver IC 6, (two of which are identified as driver chips 6a, 6b) is shown in FIG. 13(b) connected to 300 DPI LED arrays 1a and 1b. On average, every fourth driver output channel and wirebond pad 12a, 12b are not connected to LED arrays 1a, 1b resulting in a 400 DPI current driver IC driving a 300 DPI LED array.

It will be appreciated that a driver IC having 192 outputs for driving 600 DPI LED arrays may also be adapted to support 300 DPI LED arrays by skipping every other driver channel in accordance with the teachings herein. In addition, a mode can be added which skips on average every third output and thus supports 400 DPI LED arrays also.

Thus, it will be appreciated that the ability to use the same part for multiple types of printheads can result in increased volume of usage of these chips reducing the cost associated with the current driver IC. In addition, the ability of the current driver IC to be programmed for operating current level makes it possible to adjust the current driver IC to match the different current levels required by different LED arrays at different resolutions.

Additionally, it makes it possible to use driver chips at a lower LED resolution which upon test are found to have failures on one or more output channels if those channels correspond to those not used at the lower LED resolution.

In order to implement this multi-resolution compatibility for the driver IC, a control register cell associated with the IEEE 1149.1 architecture provides for mode select where individual modes correspond to operation with specific resolution LED arrays. As noted above, the control register state is alterable via the IEEE 1149.1 serial bus inputs TDI, TCK, TMS. This is only one preferred implementation of many possible to control which channels on the current driver IC are disabled. For example, another method would be through the use of dedicated mode select lines.

With reference to FIG. 14, a schematic of a token bit register 26 or chain with skip logic is illustrated. As noted above, the token chain is adapted to move a token bit from stage to stage for use in causing image data to be latched in appropriate data latch registers 24(FIG. 5). The token chain includes a series of flip-flop register cells 29 (only FF4, FF5, FF6 are shown) with one of each of the register cells being associated with the image data latching portion of a respective current driver channel. Thus, for a driver IC nominally supporting 64 driver current driver channels, there are 64 flip-flop register cells 29 with only 3 stages of the token chain being illustrated. The token lines (27), token 4, token 5 and token 6, are output respectively from one output of a flip-flop and connected to a respective data latch register 24. The inputs to the flip-flops 29 are a token clock signal input (SHFTCLK) at a clock input of the flip-flop, a token bit signal input at a D input of the flip-flop and a reset signal input at a clear input of the flip-flop. As the token chain is operational selectively in the left to right or right to left direction, tri-state inverters or buffers 131 or alternatively multiplexers are provided which have a respective control signal (left to right shift control (SHFLTR), right to left shift control (SHFRTL) that enables the inverters to pass the token bit signal in a defined direction.

Assume in the embodiment of FIG. 14 the shift direction control signal enables the token chain for passage of the token bit signal in the left to right direction; i.e. the logic signal SHFLTR is input to the token bit register core 26 of this driver chip and is of a logic level so as to enable certain buffers 131 to pass the token bit signal while the signal SHFRTL is of a logic level to inhibit other buffers 131 from passing the token bit signal. The token bit signal which represents a single digital bit is also assumed to have been output from FF3 (not shown) and input into FF4 the output of which changes in response to an edge of a next token clock pulse (SHFTCLK). A secondary token bit signal is then output from a first output of FF4 and is communicated over token 4 line 274 to the data latch registers 24 associated with FF4 and the fourth current driver channel so that they latch a 6-bit corrected image data signal currently on the image data bus, DA (0:5). FF4 also provides a token bit output on a primary output line that is connected through buffer 131 to a D input of FF5. At the next token clock signal, FF5 outputs a token bit signal over token 5 line 275 which latches image data now appearing on the image data bus with image data registers associated with FF5 and the fifth driver channel. The token bit signal is then output from the secondary output line of FF5 to one input of a multiplexer 60 that is enabled so as to output the token bit through a buffer 131 to the D input of FF6 which functions upon a next SHFTCLK to output a token bit on token 6 line 276 and passes the token bit also to token register cell 7. The MEC (50) is programmed to provide the data appropriate for the particular channel on the data bus in synchronization with the token clock signals to which this driver IC is connected.

The above discussion assumes that none of the registers are to be skipped because the driver chip is supporting say a 400 DPI LED chip array with say all 64 driver channels being operational. In the event that say a 300 DPI LED chip array is to be supported with say 96 LEDs and 48 of these LEDs are to be driven by one driver chip, then every fourth driver channel in each driver IC chip may be disabled and thus image data on the data bus DA(0:5) is not to be allowed to be latched into a register cell associated with a disabled channel. In order for the token bit to skip one of the channels, say the token 5 channel, the multiplexer 60 is set by a signal from the output of a logic device 156 so that an input on a secondary input line of the multiplexer connected to the primary token bit output of FF4 is enabled for output by the multiplexer 60 while the signal that is output from the logic device 156 also serves to clear or inhibit FF5. Thus, the token bit output by FF4 cannot affect FF5 (since FF5 is inhibited) but is instead permitted to skip via enabled multiplexer 60 to FF6. The signal from the logic device 56 is responsive to a bit in the IEEE 1149.1 control register cell 55 associated with this function; i.e. 400 DPI/300 DPI bit or a skip bit, which defines whether or not the skip mode is actuated. The logic device 156 is responsive to this skip bit and generates a signal or control bit which holds the token register stage of FF5 reset as well as 15 other preselected similar registers in the driver IC to be skipped in either direction.

The operation of the token chain in the right to left direction is similar with the multiplexer 62 serving to allow selective skip of the token bit from FF6 to FF4 when the bit stored in the IEEE 1149.1 control register cell 55 indicates a skip mode is active and the right to left shift control signal (SHFRTL) enables the right to left tristate inverters or buffers 131 and the left to right shift control signal (SHFLTR) disables the left to right tri-state inverters or buffers.

Depending upon the size of the driver chip relative to the LED chip, skipping every so many output channels may not be the best solution to the problem of using the same driver for multiple density LED arrays. This occurs for the following reasons which will be described with reference to FIG. 13(*b*) which illustrates an identical driver Ics 6*a*, 6*b* to driver IC chip 6 shown in FIG. 13(*a*) but connected to LED chip arrays 1*a*, 1*b* that have fewer numbers of LEDs on the chip arrays than the LED arrays 1 shown in FIG. 13(*a*).

During construction of the printhead, i.e., assembly of the LED arrays on the printhead or module support, it is desirable to provide a spacing between end LEDs 2*a*, 2*b* across LED array chip boundaries that is identical with that between adjacent LEDs on each of the LED chip arrays (1*a*, 1*b*) to maximize image quality. This causes the LED array to array gaps 9 to be small, resulting in the need for highly accurate dimensional control when they are singulated from the wafer and very accurate relative placement during printhead construction. The current driver IC chip 6*a*, 6*b* does not require as accurate placement if it sized so that its length is significantly smaller than the LED array. As the driver chip IC length is reduced to aid in manufacturing, in order to minimize angling of wire bonds 5*a* it may become desirable to skip fewer of the outer driver IC channels (i.e. those closer to the ends of the driver IC) and more of the inner output driver IC channels. The result is that it may not be optimal to skip every fourth channel or its corresponding bond pad 12*a*, but rather a more complex solution results which is dependent on the wirebond pad 4*a* and 7*a* locations on both driver IC chip 6*a* and LED array 1*a*. Further details regarding such are not essential to understanding of the operation of the driver chip described herein but may be had with reference to copending U.S. application Ser. No. 08/580,262 entitled "Method For Constructing A Light-Emitting Diode Printhead With A Multiple DPI Resolution Driver IC" filed on even date herewith in the name of Paul Fleming, the contents of which are incorporated herein by reference. Briefly, in the patent application there is described a method for determining connections between driver IC and LED array that provides for connecting an LED array chip to the driver channels so that connections are made to the closest bond pads on the respective chips. However, since the number of skipped channels, for example 16, remains the same and the operation of the driver is identical it is merely necessary to determine the identity of which channels are to be skipped when the driver IC is used in the 300 dpi mode and to design the driver IC so as to locate the multiplexers 60, 62 used for skipping with the appropriate connections to the channels involved.

Although the invention has been illustrated with reference to a specific example of an LED printhead, it will be appreciated that printheads incorporating other types of recording elements such as lasers, thermal, electrographic, ink jet, etc. may be employed.

The use of IEEE 1149.1 architecture as a means of controlling the printhead offers two advantages. By utilizing a secondary data path for providing control signals to the printhead rather than the primary image data path used during normal operation it becomes possible to alter the configuration of the printhead as discussed herein while it is loading image data and exposing lines of information. Within the IEEE 1149.1 standard and the driver chip design implementation described in detail herein, it is possible to load the new operating configuration and hold off on enabling the new configuration (so as not to change operation during the exposure of a line of pixels currently being recorded). This yields the advantage that use of the printhead in normal operation is only limited by the length of the update command and not the length (and corresponding time) required to serially load all the configuration data. This avoids the need to introduce skip frames or increase the interframe length/time between image frames being recorded. The second advantage is that by using the IEEE 1149.1 interface the need for a third serial data path is avoided. This reduces the cost/complexity of the signal distribution boards, and reduces wirebond count but yet provides for improved testability of a printhead.

The invention has been described in detail with particular reference to preferred embodiments thereof and illustrative examples, but it will be understood that variations and modifications can be effected within the spirit and scope of the invention.

We claim:

1. A driver IC chip for use in a non-impact printhead having a plurality of recording elements, the driver IC chip comprising:

a current driver including a plurality of current-carrying channels that are operative for carrying current to respective recording elements on the printhead; and a controller that controls operation of the current driver;

the controller including a test circuit interface that includes:

(a) a test access port for input of update command signals and clock inputs to said test circuit:

(b) a test data input terminal for inputting test data and control data into said chip;

(c) a plurality of registers connected to the test data input terminal, at least one of said plurality of registers storing control data for controlling operation of the current driver;

(d) a test data output terminal for outputting test data and control data from said chip to an adjacent chip;

(e) a selection circuit connected to said plurality of registers and said test data output terminal that is operative to select test and control data for output from said test data output terminal; and the driver IC chip including an image data storage register means associated with each channel for storing first image data for recording a current pixel and second image data for recording a subsequent pixel, one of said plurality of registers including a current control register means for storing a first set of current control data for controlling current in each channel for recording the current pixel and a second set of current control data for controlling current in each channel for recording the subsequent pixel; and means, responsive to an update command, for updating said control register to output said second set of current control data for controlling current in each channel for recording the subsequent pixel after termination of a period for recording said current pixel.

2. The driver IC chip of claim 1 and wherein said selection circuit includes an instruction register for storing instructions for selecting one of said plurality of registers for receiving data from said test data input terminal and for selecting one of said plurality of registers for outputting data from one of said plurality of registers for controlling said current driver.

3. The driver IC chip of claim 1 including register means for storing a signal used to enable a recording element; and means for outputting said signal in a test mode to one of said plurality of registers to test for operability of said chip.

4. A printhead comprising:

a recording element;

an integrated circuit driver for generating current for driving the recording element for recording, the driver including means for storing first image data for recording a current pixel and means for storing second image data for recording a subsequent pixel by the recording element;

the driver including a test circuit that includes register means having a boundary scan architecture for testing connectivity on the driver, the test circuit including a data input terminal and a data output terminal;

the register means including means for storing control data other than image data for determining a control feature for operation of the driver in a non-test mode;

means for storing in said register means new control data during loading of second image data and printing of first image data without affecting said control feature of the driver during printing of the first image data; and a circuit device for providing a signal that updates said control feature in accordance with the new control data after recording of said first image data to affect control of said feature for recording said second image data.

5. A method of non-impact printing using a plurality of recording elements, the method comprising the steps of:

selectively energizing a plurality of current-carrying channels that are operative for carrying current to respective recording elements for recording a current line of pixels; and controlling operation of current in the channels;

the step of controlling including:

(a) providing a test circuit interface that includes a test access port for receiving inputs of update command signals and clock inputs to said test circuit; and (b) inputting new control data, for controlling current in the channels for recording a subsequent line of pixels, into a plurality of register cells connected to the test data input terminal during operation of the recording elements for recording the current line of pixels without affecting current in the channels for recording the subsequent line of pixels.

6. A printhead comprising:

a plurality of recording elements; and a plurality of integrated circuit driver chips having circuits for generating current for driving respective ones of the recording elements for recording, each integrated circuit driver chip including:

(a) a first data storage device for storing first image data for recording a current pixel and a second data storage device for storing second image data for recording a subsequent pixel by each of the respective recording elements;

(b) a test circuit that includes a plurality of registers including at least one register for testing connectivity on the driver chip, the test circuit including a test data input terminal and a test data output terminal, the plurality of registers including a register that stores new control data other than image data for determining a control feature for operation of the driver chip in a non-test mode, the new control data being stored in the register during loading of second image data in the second data storage device, the test circuit including an instruction register for storing instructions for selecting said register for outputting the new control data for controlling said driver after recording of the current pixel to affect a new control for recording the subsequent pixel, the presence of said new control data in said register not affecting control of the recording of the current pixel.

7. The printhead of claim 6 and wherein each of said integrated circuit driver chips includes a plurality of current-carrying channels, a current mirror for controlling current in said current-carrying channels, said current mirror including a master circuit to which said current-carrying channels are slaved, said master circuit including a plurality of selectively operable circuits for controlling current in the master circuit and said plurality of registers has an output for the control data for selectively operating said circuits to control current in the master circuit.

8. The printhead of claim 7 and wherein an additional current-carrying channel is provided for generating a test current and said plurality of registers stores a control signal and said driver chips each include means responsive to said control signal for generating a test current in said additional channel.

9. A printhead of claim 6 and wherein each of said integrated circuit driver chips includes a plurality of selectively operable circuits for controlling current in a plurality of current-carrying channels for driving respective recording elements, said circuits being responsive to said control data for controlling current in the current-carrying channels and in response to an update command signal input to said test access port, said control data is output in parallel from said plurality of registers.

10. The printhead of claim 9 and wherein each of said integrated circuit driver chips includes means for generating a test current in an additional channel not associated with a recording element; and said at least one register stores control data for generating a test current in said additional channel.

11. The printhead of claim 6 and means for connecting adjacent integrated circuit chips so that a test data input terminal of one integrated circuit driver chip receives data from a test data output terminal of an adjacent integrated circuit driver chip.

12. The printhead of claim 11 and wherein a register of said plurality of registers of each of said integrated circuit driver chips stores a printhead resolution signal for determining printhead resolution and each of said integrated circuit driver chips includes means responsive to said printhead resolution signal for blocking image data signals from being stored in storing means associated with certain recording channels not to be used at the determined resolution.

13. A driver IC chip for use in driving at least one recording element comprising:
  a driver circuit for generating current for driving the recording element for recording, the driver circuit including a data store for storing first image data for recording a current pixel and a data store for storing second image data for recording a subsequent pixel by the recording element;
  a test circuit controller that includes a plurality of registers having a boundary scan architecture for testing connectivity on the driver IC chip or with a component connected to the driver IC chip, the test circuit controller including a test data input terminal and a test data output terminal;
  the registers including a register for storing control data other than image data for determining a control feature for operation of the driver IC chip in a non-test mode;
  the controller providing control to said plurality of registers to store new control data during loading of second image data and printing of first image data without affecting said control feature of the driver IC chip during printing of the first image data; and wherein
  the controller provides a signal that updates said control feature in accordance with the new control data after recording of said first image data to affect control of said feature for recording said second image data.

14. The driver IC chip of claim 13 and including:
  a plurality of said driver circuits including a plurality of current-carrying channels that are operative for carrying current to respective recording elements on a printhead; and wherein the controller includes:
    (a) a test access port for input of update command signals and clock inputs to said test circuit controller;
    (b) the data input terminal that is adapted to receive test data and control data into said chip;
    (c) the plurality of registers being connected to the test data input terminal, the registers storing control data for controlling operation of said driver circuits;
    (d) the data output terminal adapted to output test data and control data from said chip to an adjacent chip; and
    (e) a selection circuit connected to said plurality of registers and said test data output terminal that is operative to select test and control data for output from said test data output terminal.

15. A printhead including a plurality of driver IC chips as defined in claim 14, the printhead further including a plurality of recording elements; electrical connections connecting the current-carrying channels to respective recording elements; a connector that connects adjacent driver chips so that a test data input terminal of one driver IC chip receives data from a test data output terminal of an adjacent driver IC chip.

16. The printhead of claim 15 and wherein one of said plurality of registers is responsive to an update command signal to output data onto an output conductor associated with said registers.

17. The printhead of claim 16 and including a data bus for carrying image data signals; said driver IC chips including storage means associated with each channel for storing an image data signal.

18. The printhead of claim 11 and wherein one of said plurality of registers in each of said driver IC chips stores a printhead resolution signal for determining printhead resolution, and each of said driver chips includes means responsive to said printhead resolution signal for blocking image data signals from said data bus from being stored in certain storage means associated with certain ones of said current-carrying channels.

19. The driver IC chip of claim 14 and wherein said selection circuit includes an instruction register for storing instructions for selecting one of said plurality for registers for receiving data from said test data input terminal and for selecting one of said plurality of registers for outputting data from one of said plurality of registers for controlling said plurality of driver circuits.

20. The driver IC chip of claim 19 and wherein said driver circuits include a current mirror for controlling current in said current-carrying channels, and said current mirror includes a master circuit to which said current-carrying channels are slaved, said master circuit includes a plurality of selectively operable circuits for controlling current in the master circuit and one of said plurality of registers includes data for selectively operating said circuits to control current in the master circuit.

21. The driver IC chip of claim 20 and wherein an additional current-carrying channel is provided for generating a test current and one of said plurality of registers includes a control bit and said driver IC chip includes means responsive to said control bit for generating a test current in said additional channel.

22. The driver IC chip of claim 19 and including a plurality of selectively operable circuits for controlling current in the current-carrying channels, said selectively operable circuits being responsive to said control data for controlling current in the current-carrying channels and in response to an update command signal input to said test access port, said control data is output in parallel from one of said plurality of registers.

23. The driver IC chip of claim 19 and wherein an additional current carrying channel is provided for generating a test current and one of said plurality of registers includes a control bit and said driver IC chip includes means responsive to said control bit for generating a test current in said additional channel.

24. A method of operating a printhead that includes a recording element and an integrated circuit driver chip for generating current for driving the recording element for recording, the method comprising:

storing on the driver chip first image data for recording a current pixel and second image data for recording a subsequent pixel by the recording element;

operating a test circuit that includes registers having a boundary scan architecture and testing connectivity on the driver, the test circuit including a data input terminal and a data output terminal;

storing in the registers control data other than image data for determining a control feature for operation of the driver in a non-test mode, the registers storing the new control data during loading of second image data and printing of first image data without affecting said control feature of the driver during printing of the first image data; and providing a signal that updates said control feature in accordance with the new control data after recording of said first image data to affect control of said feature for recording said second image data.

* * * * *